(12) United States Patent
Leng

(10) Patent No.: US 11,769,793 B2
(45) Date of Patent: Sep. 26, 2023

(54) METAL-INSULATOR-METAL (MIM) CAPACITOR MODULE

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

( * ) Notice: Subject to any disclaimer, the term of this patent is extended or adjusted under 35 U.S.C. 154(b) by 38 days.

(21) Appl. No.: 17/516,141

(22) Filed: Nov. 1, 2021

(65) Prior Publication Data

US 2023/0082867 A1 Mar. 16, 2023

Related U.S. Application Data

(60) Provisional application No. 63/242,643, filed on Sep. 10, 2021.

(51) Int. Cl.
| | |
|---|---|
| *H01L 23/522* | (2006.01) |
| *H01L 49/02* | (2006.01) |
| *H01L 21/768* | (2006.01) |

(52) U.S. Cl.
CPC .......... *H01L 28/92* (2013.01); *H01L 21/7687* (2013.01); *H01L 23/5223* (2013.01); *H01L 23/5226* (2013.01)

(58) Field of Classification Search
CPC ..... H01L 23/5223; H01L 28/92; H01L 28/91; H01L 28/56
See application file for complete search history.

(56) References Cited

U.S. PATENT DOCUMENTS

| | | | | |
|---|---|---|---|---|
| 6,436,787 | B1* | 8/2002 | Shih | H01L 28/55 257/E21.019 |
| 6,441,419 | B1* | 8/2002 | Johnson | H01L 21/76843 257/E21.018 |
| 6,451,664 | B1* | 9/2002 | Barth | H01L 28/60 257/E21.011 |
| 6,646,323 | B2* | 11/2003 | Dirnecker | H01L 23/5223 257/532 |
| 6,876,028 | B1* | 4/2005 | Coolbaugh | H01L 23/53238 257/305 |
| 2002/0163029 | A1* | 11/2002 | Dirnecker | H01L 28/40 257/E21.582 |
| 2002/0179955 | A1* | 12/2002 | Morimoto | H01L 21/76831 257/E21.582 |
| 2005/0067701 | A1 | 3/2005 | Coolbaugh et al. | 257/751 |

(Continued)

OTHER PUBLICATIONS

International Search Report and Written Opinion, Application No. PCT/US2022/019669, 12 pages, dated Aug. 2, 2022.

*Primary Examiner* — Ahmed N Sefer
(74) *Attorney, Agent, or Firm* — SLAYDEN GRUBERT BEARD PLLC

(57) ABSTRACT

A metal-insulator-metal (MIM) capacitor module is provided. The MIM capacitor module includes a bottom electrode base formed in a lower metal layer, a bottom electrode conductively coupled to the bottom electrode base, a planar insulator formed over the bottom electrode, and a top electrode formed in an upper metal layer over the insulator. The bottom electrode includes a cup-shaped bottom electrode component and a bottom electrode fill component formed in an interior opening defined by the cup-shaped bottom electrode component.

14 Claims, 13 Drawing Sheets

(56) References Cited

U.S. PATENT DOCUMENTS

| | | | |
|---|---|---|---|
| 2005/0142851 A1* | 6/2005 | Kim | H01L 28/40 |
| | | | 438/624 |
| 2005/0263848 A1* | 12/2005 | Cho | H01L 28/60 |
| | | | 257/532 |
| 2006/0157766 A1* | 7/2006 | Won | H01L 28/60 |
| | | | 257/E21.59 |
| 2007/0152258 A1* | 7/2007 | Kim | H01L 23/5223 |
| | | | 257/E21.011 |
| 2010/0181647 A1* | 7/2010 | Imai | H01L 23/5223 |
| | | | 257/532 |
| 2012/0091559 A1 | 4/2012 | Tu et al. | 257/532 |
| 2013/0069200 A1* | 3/2013 | Raghavan | H01L 28/90 |
| | | | 257/532 |
| 2014/0264748 A1* | 9/2014 | Fujiwara | H01L 23/5223 |
| | | | 257/532 |
| 2015/0144859 A1* | 5/2015 | Chen | H10N 70/066 |
| | | | 257/4 |
| 2016/0284792 A1* | 9/2016 | Tu | H01L 28/40 |
| 2021/0020590 A1* | 1/2021 | Chiu | H01L 28/60 |
| 2021/0091169 A1* | 3/2021 | Lin | H10B 61/10 |

\* cited by examiner

1402 — FORM A LOWER METAL LAYER $M_x$ INCLUDING A BOTTOM ELECTRODE BASE AND A LOWER INTERCONNECT ELEMENT, THE LOWER METAL LAYER $M_x$ COMPRISING A LOWER INTERCONNECT METAL LAYER (e.g., ALUMINUM) OR A SILICIDED POLYSILICON LAYER

1404 — DEPOSIT DIELECTRIC REGION (e.g., OXIDE) OVER THE LOWER METAL LAYER $M_x$ AND PLANARIZE THE DIELECTRIC REGION, e.g., BY CMP PROCESS

DAMASCENE BOTTOM ELECTRODE FORMATION

1406 — PATTERN AND ETCH DIELECTRIC REGION TO FORM A TUB OPENING, A BOTTOM ELECTRODE CONTACT OPENING, AND AN INTERCONNECT VIA OPENING

1408 — DEPOSIT CONFORMAL METAL (e.g., TUNGSTEN) TO CONCURRENTLY FORM (A) CUP-SHAPED BOTTOM ELECTRODE COMPONENT IN TUB OPENING, (B) BOTTOM ELECTRODE CONTACT IN BOTTOM ELECTRODE CONTACT OPENING, AND (C) INTERCONNECT VIA IN THE INTERCONNECT VIA OPENING

1410 — DEPOSIT FILL METAL (e.g., TiN) TO FORM A BOTTOM ELECTRODE FILL COMPONENT IN INTERIOR OPENING OF THE CUP-SHAPED BOTTOM ELECTRODE COMPONENT

1412 — PERFORM PLANARIZATION PROCESS TO DEFINE PLANARIZED INSULATOR SUPPORT SURFACE INCLUDING A PLANARIZED TOP SURFACE OF THE CUP-SHAPED BOTTOM ELECTRODE COMPONENT, A PLANARIZED TOP SURFACE OF THE BOTTOM ELECTRODE FILL COMPONENT, AND PLANARIZED TOP SURFACE AREAS OF THE DIELECTRIC REGION ON OPPOSITE SIDES OF THE BOTTOM ELECTRODE (IN THE X-DIRECTION, OR IN BOTH THE X-DIRECTION AND Y-DIRECTION)

1414 — FORMING A PLANAR INSULATOR ON THE PLANARIZED INSULATOR SUPPORT SURFACE, THE PLANAR INSULATOR EXTENDING ACROSS AND BEYOND THE FULL LATERAL WIDTH OF THE BOTTOM ELECTRODE AND HAVING A UNIFORM VERTICAL THICKNESS ACROSS THE FULL LATERAL WIDTH OF THE PLANAR INSULATOR (IN THE X-DIRECTION, OR IN BOTH THE X-DIRECTION AND Y-DIRECTION)

1416 — FORMING UPPER METAL LAYER $M_{x+1}$, INCLUDING (A) TOP ELECTRODE OVER THE INSULATOR AND (B) BOTTOM ELECTRODE CONNECTION ELEMENT CONDUCTIVELY CONNECTED TO THE BOTTOM ELECTRODE CONTACT, AND (C) AN UPPER INTERCONNECT ELEMENT CONDUCTIVELY CONNECTED TO THE INTERCONNECT VIA

METAL-INSULATOR-METAL (MIM) CAPACITOR MODULE

RELATED PATENT APPLICATION

This application claims priority to commonly owned U.S. Provisional Patent Application No. 63/242,643 filed Sep. 10, 2021, the entire contents of which are hereby incorporated by reference for all purposes.

TECHNICAL FIELD

The present disclosure relates to metal-insulator-metal (MIM) capacitors formed in integrated circuit structures.

BACKGROUND

A metal-insulator-metal (MIM) capacitor is a capacitor constructed with a metal top electrode, a metal bottom electrode, and an insulator (dielectric) sandwiched between the two electrodes.

MIM capacitors are important components in many electrical circuits, for example many analog, mixed-signal, and radio-frequency complementary metal-oxide semiconductors (RF CMOS) circuits. MIM capacitors typically provide better performance than alternatives, such as POP (poly-oxide-poly) capacitors and MOM (metal-oxide-metal lateral flux) capacitors, due to lower resistance, better matching for analog circuits (e.g., matching device characteristics such as resistance and capacitance), and/or better signal/noise ratio.

MIM capacitors are typically constructed between two interconnect metal layers (e.g., aluminum layers), referred to as metal layers $M_x$ and $M_{x+1}$. For example, an MIM capacitor may be formed using an existing metal layer $M_x$ as the bottom electrode (bottom plate), constructing an insulator and a top electrode (top plate) over the bottom electrode, and connecting an overlying metal layer $M_{x+1}$ to the top and bottom electrodes by respective vias. The top electrode formed between the two metal layers $M_x$ and $M_{x+1}$ may be formed from a different metal than the metal layers $M_x$ and $M_{x+1}$. For example, the metal layers $M_x$ and $M_{x+1}$ may be formed from aluminum, whereas the top electrode may be formed from titanium/titanium nitride (Ti/TiN), tantalum/tantalum nitride (Ta/TaN), or tungsten (W), for example.

The top electrode typically has a higher resistance than the bottom electrode, for example because the top electrode may be limited by thickness constraints and the material of choice, thus limiting the performance of conventional MIM capacitors. MIM capacitors typically have very narrow process margins, particularly for a metal etch used to form the top electrode.

In addition, for MIM capacitors formed in aluminum interconnect (i.e., where metal layers $M_x$ and $M_{x+1}$ comprise aluminum interconnect layers), the aluminum bottom electrode may be susceptible to hillock formation at a top side of the bottom electrode, e.g., resulting from high-temperature processing of aluminum, a low-melting-point metal. Hillocks formed on the bottom electrode may negatively or unpredictably affect the breakdown voltage of the MIM capacitor.

FIGS. 1A-1F show cross-sectional side views of an example prior art process for forming an MIM capacitor module 10. As shown in FIG. 1A, a metal interconnect layer $M_x$ is formed over a dielectric region, e.g., an inter-metal dielectric (IMD) layer indicated as $IMD_x$. Metal layer $M_x$ may be formed from aluminum or other suitable metal.

Next, as shown in FIG. 1B, an insulator layer 100 is deposited, followed by a top electrode layer 102 from which a top electrode (top plate) of the MIM capacitor module 10 is formed, as shown in FIG. 1C discussed below. The insulator layer 100 may comprise silicon nitride ($Si_3N_4$, also referred to more simply as SiN) with a thickness $T_{ins}$ of about 500 Å, which may be deposited by a plasma enhanced chemical vapor deposition (PECVD) process. The top electrode layer 102 may comprise titanium nitride (TiN), tantalum (Ta), tantalum nitride (TaN), or other suitable metal with thickness $T_{te}$ of about 2000 Å. The thickness $T_{te}$ of the top electrode layer 102, which defines the thickness of the capacitor top electrode 108 (see FIG. 1C), is typically limited by the thickness of a subsequently formed IMD layer $IMD_{x+1}$ (shown in FIG. 1F discussed below). For example, the thickness $T_{te}$ of the top electrode layer 102 may be limited by the thickness of the subsequently formed $IMD_{x+1}$ layer (see FIG. 1F, discussed below), an etch margin of the top electrode etch (see FIG. 1C, discussed below), and a process margin of a subsequent chemical mechanical planarization (CMP), for example. For a typical $IMD_{x+1}$ layer thickness of 8000 Å, the thickness $T_{te}$ of the top electrode 102 may be limited to about 3000 Å or less. This limited thickness $T_{te}$ of the top electrode layer 102 (and thus capacitor top electrode 108) can result in a high series resistance and low quality factor (Q-factor) for certain applications, e.g., radio frequency (RF) applications.

After the insulator layer 100 and top electrode layer 102 are deposited, information printed in the wafer scribe region may be very difficult to read (through the insulator layer 100, top electrode layer 102, and underlying metal layer Mx), which can cause manufacturing problems. For example, the wafer lot number and/or wafer number printed in the wafer scribe region may be difficult to read, which may cause various problems, e.g., inability to run controlled experiments with designated wafers split among different process conditions or record wafer activities (e.g., scrap or incident events) tied to wafer number.

Next, as shown in FIG. 1C, a photoresist layer is deposited and patterned to form a first photomask 106 over the top electrode layer 102, and an etch is performed to define the MIM capacitor top electrode 108 from the top electrode layer 102, wherein the portion of the silicon nitride insulator layer 100 below the top electrode 108 defines the MIM capacitor insulator, indicated at 100a. The top electrode etch typically has a very small process margin. In particular, the etch is designed to stop approximately halfway through the thickness $T_{ins}$ of the insulator layer 100.

The precise depth of the top electrode etch, which defines the thickness $T_{ins\_etched}$ of the remaining insulator layer 100 outside the footprint of the top electrode 108, indicated as etched insulator layer region 100b, is typically sensitive to specific process parameters, such as silicon nitride deposition thickness and non-uniformity, and etch uniformity and selectivity, for example. If the etch is insufficiently deep (such that $T_{ins\_etched}$ of the etched insulator layer region 100b is too thick), the top electrode layer 102 may not be completely removed in some areas on the wafer (e.g., due to non-uniformity of the etch across the wafer), thus leaving metal residue or stringers on the wafer. These metal residue or stringers may cause incomplete etching in a subsequent metal etch step, create metal shorts, and lead to device yield loss or reliability failure.

On the other hand, if the top electrode etch is too deep (such that $T_{ins\_etched}$ of the etched insulator layer region 100b is too thin), the resulting MIM capacitor module 10 may have an unsuitably low breakdown voltage, in particular due to the corner "C" formed in the insulator layer 100 by the top electrode etch discussed above, as discussed below with respect to FIG. 1F.

Thus, the effective margin for the thickness $T_{ins\_etched}$ of the etched insulator layer region 100b may be very small, thereby defining small process margins for the top electrode etch. For example, for a deposited silicon nitride insulator layer having a thickness $T_{ins}$ of 500Å, an effective target thickness $T_{ins\_etched}$ of the etched insulator layer region 100b may have a very small margin, for example between 230-270 Å.

Next, as shown in FIG. 1D, remaining portions of the first photomask 106 are removed and a new photoresist layer is deposited and patterned to form a second photomask 112 over the top electrode 108 and extending beyond the top electrode 108 in a first lateral direction.

Next, as shown in FIG. 1E, a metal etch is performed to define the MIM capacitor bottom electrode 116.

Finally, as shown in FIG. 1F, construction of the MIM capacitor module 10 is completed by removing the second photomask 112, forming an IMD layer ($IMD_{x+1}$), forming vias 120 respectively contacting the top electrode 108 and bottom electrode 116, and forming a top electrode contact 122 and a bottom electrode contact 124 in a metal layer $M_{x+1}$ over the $IMD_{x+1}$ layer.

The prior art MIM capacitor module 10 may suffer from various shortcomings. For example, as noted above, the thickness $T_{te}$ of the top electrode 108 may be limited due to a vertical spacing limitation between metal layers $M_x$ and $M_{x+1}$, represented by the thickness $T_{IMD_{x+1}}$ of the $IMD_{x+1}$ region. The limited thickness $T_{te}$ of the top electrode 108 may result in high serial resistance unsuitable for certain applications (e.g., RF applications).

In addition, the MIM capacitor may have a low and/or unpredictable breakdown voltage. For example, the capacitor breakdown voltage may be very sensitive to the thickness $T_{ins\_etched}$ of the etched insulator layer region 100b, particularly at the corner C below the lateral edge of the top electrode 108, as discussed above. In addition, the capacitor breakdown voltage may also be sensitive to hillocks "H" formed on the capacitor bottom electrode 116. Hillock formation may be very difficult to control in the fabrication process discussed above. For example, hillocks H may form on the bottom electrode 116 as a result of various heated process steps during and after the capacitor fabrication, including heat treatment steps and/or heated aluminum deposition steps (e.g., performed at 400° C.). These hillocks H may create an uncontrolled low breakdown voltage of the capacitor module 10.

In addition, as noted above, the deposition of the various material layers (lower metal layer, insulation layer, and top electrode layer) over the wafer scribe region may hinder the ability to read information printed in the wafer scribe region (e.g., wafer number and lot number), which may complicate the manufacturing process.

There is a need for improved MIM capacitor modules and formation processes that provide wider process margins and/or better capacitor performance.

SUMMARY

The present disclosure provides an integrated MIM capacitor module including a bottom electrode base formed in a lower metal layer $M_x$, a bottom electrode conductively coupled to the bottom electrode base, a planar insulator formed over the bottom electrode, a top electrode formed in an upper metal layer $M_{x+1}$ over the planar insulator, a bottom electrode connection element formed in the upper metal layer $M_{x+1}$, and a bottom electrode contact conductively connecting the bottom electrode connection element to the bottom electrode base. The bottom electrode includes a cup-shaped bottom electrode component and a bottom electrode fill component formed in an interior opening defined by the cup-shaped bottom electrode component.

One aspect provides a metal-insulator-metal capacitor module including a bottom electrode base formed in a lower metal layer, a bottom electrode conductively coupled to the bottom electrode base, a planar insulator formed over the bottom electrode, and a top electrode formed in an upper metal layer over the planar insulator. The bottom electrode includes a cup-shaped bottom electrode component, and a bottom electrode fill component formed in an interior opening defined by the cup-shaped bottom electrode component.

In one embodiment, the planar insulator has a uniform vertical thickness across a full lateral width of the planar insulator.

In one embodiment, the bottom electrode is formed in a dielectric region, and the planar insulator is formed on a planarized insulator support surface including (a) a planarized top surface of the cup-shaped bottom electrode component, (b) a planarized top surface of the bottom electrode fill component, and (c) planarized top surface areas of the dielectric region on opposite sides of the bottom electrode. The planar insulator extends laterally across and beyond a full lateral width of the bottom electrode, such that the planar insulator extends over the planarized top surface areas of the dielectric region on opposite sides of the bottom electrode.

The planar insulator may have a uniform vertical thickness across a full lateral width of the planar insulator. In some examples, the planar insulator has a uniform vertical thickness across a full lateral width of the planar insulator in a first lateral direction. In some examples, the planar insulator has a uniform vertical thickness across a full lateral width of the planar insulator in a first lateral direction and in a second lateral direction perpendicular to the first lateral direction.

In one embodiment, the bottom electrode is formed in a dielectric region, the planar insulator extends laterally across and beyond a full lateral width of the bottom electrode, such that the planar insulator extends over portions of the dielectric region laterally adjacent the bottom electrode, and the planar insulator has a uniform vertical thickness across a full lateral width of the planar insulator.

In one embodiment, the bottom electrode is formed in a dielectric region, the planar insulator extends laterally across and beyond a full lateral width of the bottom electrode in a first lateral direction and in a second lateral direction perpendicular to the first lateral direction, such that the planar insulator extends over portions of the dielectric region laterally adjacent the bottom electrode in both the first and second lateral directions, and the planar insulator has a uniform vertical thickness across a full lateral width of the planar insulator in both the first and second lateral directions.

In one embodiment, the cup-shaped bottom electrode component is formed on the bottom electrode base.

In one embodiment, the planar insulator is formed on a planarized insulator support surface including a planarized top surface of the cup-shaped bottom electrode component and a planarized top surface of the bottom electrode fill component.

In one embodiment, the bottom electrode is formed in a dielectric region between the lower metal layer and the upper metal layer, and the metal-insulator-metal capacitor module includes a bottom electrode connection element formed in the upper metal layer, and a bottom electrode contact formed in the dielectric region between the lower metal layer and the upper metal layer, wherein the bottom electrode connection element is conductively connected to the bottom electrode base through the bottom electrode contact.

In one embodiment, the bottom electrode contact and the cup-shaped bottom electrode component are formed from a conformal metal, and the bottom electrode fill component is formed from a fill metal different than the conformal metal.

In one embodiment, the conformal metal comprises tungsten, and the fill metal comprises titanium nitride.

In one embodiment, the lower metal layer comprises a lower interconnect layer; and the upper metal layer comprises an upper interconnect layer.

In one embodiment, each of the lower interconnect layer and the upper interconnect layer is formed from aluminum.

In one embodiment, the lower metal layer comprises a silicided polysilicon layer, wherein the bottom electrode base formed in the lower metal layer comprises a metal silicide region formed on a polysilicon region, and the upper metal layer comprises a first metal interconnect layer.

In one embodiment, lateral surfaces of the top electrode are self-aligned with lateral surfaces of the planar insulator.

Another aspect provides an integrated circuit structure including an interconnect structure and a metal-insulator-metal (MIM) capacitor module. The interconnect structure includes a lower interconnect element formed in a lower metal layer, an upper interconnect element formed in an upper metal layer, and an interconnect via conductively connected between the lower interconnect element and the upper interconnect element. The MIM capacitor module includes a bottom electrode base formed in the lower metal layer, a bottom electrode conductively coupled to the bottom electrode base, a planar insulator formed over the bottom electrode, and a top electrode formed in the upper metal layer. The bottom electrode includes a cup-shaped bottom electrode component, and a bottom electrode fill component formed in an interior opening defined by the cup-shaped bottom electrode component. The cup-shaped bottom electrode component and the interconnect via are formed from a common conformal metal.

In one embodiment, the planar insulator has a uniform vertical thickness across a full lateral width of the planar insulator.

In one embodiment, the bottom electrode is formed in a dielectric region, and the planar insulator is formed on a planarized insulator support surface including (a) a planarized top surface of the cup-shaped bottom electrode component, (b) a planarized top surface of the bottom electrode fill component, and (c) planarized top surface areas of the dielectric region on opposite sides of the bottom electrode. The planar insulator extends laterally across and beyond a full lateral width of the bottom electrode, such that the planar insulator extends over the planarized top surface areas of the dielectric region on opposite sides of the bottom electrode.

In one embodiment, the bottom electrode is formed in a dielectric region, the planar insulator extends laterally across and beyond a full lateral width of the bottom electrode, such that the planar insulator extends over portions of the dielectric region laterally adjacent the bottom electrode, and the planar insulator has a uniform vertical thickness across a full lateral width of the planar insulator.

In one embodiment, a top surface of the cup-shaped bottom electrode component and a bottom electrode fill component define a planar bottom electrode top surface, and the planar insulator is formed on the planar bottom electrode top surface.

In one embodiment, the metal-insulator-metal capacitor module further comprises a bottom electrode contact providing a conductive connection between the bottom electrode base and a bottom electrode connection element formed in the upper metal layer, and wherein the interconnect via, the bottom electrode contact, and the bottom electrode are formed in a dielectric region between the lower metal layer and the upper metal layer.

In one embodiment, the interconnect via, the bottom electrode contact, and the cup-shaped bottom electrode component are formed from a common conformal metal.

In one embodiment, the lower metal layer comprises a lower interconnect layer, and the upper metal layer comprises an upper interconnect layer.

In one embodiment, the lower metal layer comprises a silicided polysilicon layer, wherein the lower interconnect element comprises a first metal silicide region formed on a first polysilicon region and the bottom electrode base comprises a second metal silicide region formed on a second polysilicon region, and the upper metal layer comprises a first metal interconnect layer.

Another aspect provides a method of forming a metal-insulator-metal capacitor module in an integrated circuit structure. A lower metal layer is formed, including a bottom electrode base. A dielectric region is deposited over the lower metal layer. The dielectric region is patterned and etched to form a tub opening and a bottom electrode contact opening. A conformal metal is deposited to concurrently form (a) a cup-shaped bottom electrode component in the tub opening and (b) a bottom electrode contact in the bottom electrode contact opening, wherein each of the cup-shaped bottom electrode component and the bottom electrode contact is conductively coupled to the bottom electrode base. A fill metal is deposited to form a bottom electrode fill component in an interior opening defined by the cup-shaped bottom electrode component. A planarization process defines a planarized insulator support surface including a planarized top surface of the cup-shaped bottom electrode component and a planarized top surface of the bottom electrode fill component. A planar insulator is formed on the planarized insulator support surface. An upper metal layer is formed, including (a) a top electrode over the planar insulator and (b) a bottom electrode connection element conductively connected to the bottom electrode contact.

In one embodiment, the planar insulator has a uniform vertical thickness across a full lateral width of the planar insulator.

In one embodiment, the planarized insulator support surface formed by the planarization process includes the planarized top surface of the cup-shaped bottom electrode component, the planarized top surface of the bottom electrode fill component, and planarized top surface areas of the dielectric region on opposite sides of the bottom electrode. The planar insulator extends laterally across and beyond a full lateral width of the bottom electrode, such that the planar insulator extends over the planarized top surface areas of the dielectric region on opposite sides of the bottom electrode.

In one embodiment, the planar insulator extends laterally across and beyond a full lateral width of the bottom electrode, such that the planar insulator extends over portions of the dielectric region laterally adjacent the bottom electrode, and the planar insulator has a uniform vertical thickness across a full lateral width of the planar insulator.

In one embodiment, the method includes depositing an insulator layer on the planarized insulator support surface, depositing an upper metal layer on an insulator layer region of the insulator layer, and patterning and etching the upper metal layer and underlying insulator layer region to define the top electrode and the planar insulator underlying the top electrode, wherein lateral surfaces of the top electrode are self-aligned with lateral surfaces of the planar insulator.

Another aspect provides a method of forming an integrated circuit structure including a metal-insulator-metal capacitor and an interconnect structure. A lower metal layer is formed, including a bottom electrode base and a lower interconnect element. A dielectric region is deposited over the lower metal layer. The dielectric region is patterned and etched to form (a) a tub opening and a bottom electrode contact opening over the bottom electrode base and (b) an interconnect via opening over the lower interconnect element. A conformal metal is deposited to concurrently form (a) a cup-shaped bottom electrode component in the tub opening, (b) a bottom electrode contact in the bottom electrode contact opening, and (c) an interconnect via in the interconnect via opening. A fill metal is deposited to form a bottom electrode fill component in an interior opening defined by the cup-shaped bottom electrode component. A planarization process defines a planarized insulator support surface including a planarized top surface of the cup-shaped bottom electrode component and a planarized top surface of the bottom electrode fill component. The cup-shaped bottom electrode component and the bottom electrode fill component collectively define a bottom electrode. A planar insulator is formed on the planarized insulator support surface. An upper metal layer is formed, including (a) a top electrode over the planar insulator, (b) a bottom electrode connection element conductively connected to the bottom electrode contact, and (c) an upper interconnect element conductively connected to the interconnect via.

BRIEF DESCRIPTION OF THE DRAWINGS

Example aspects of the present disclosure are described below in conjunction with the figures, in which:

FIG. 14 is a flowchart showing an example method of forming an example integrated circuit structure including an example MIM capacitor module and nearby interconnect structure, according to one example.

Figure 1A:
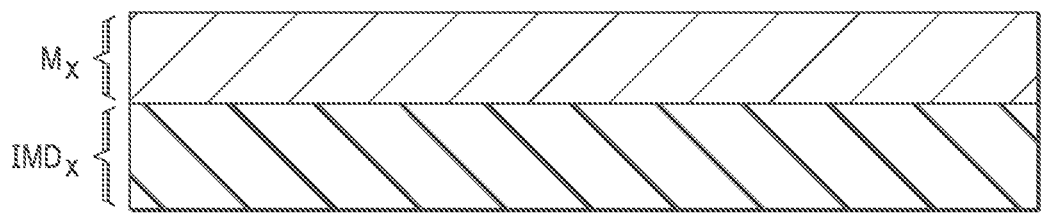
FIGS. 1A-1F are cross-sectional side views showing an example prior art process for forming an example MIM capacitor module.
Figure 1B:
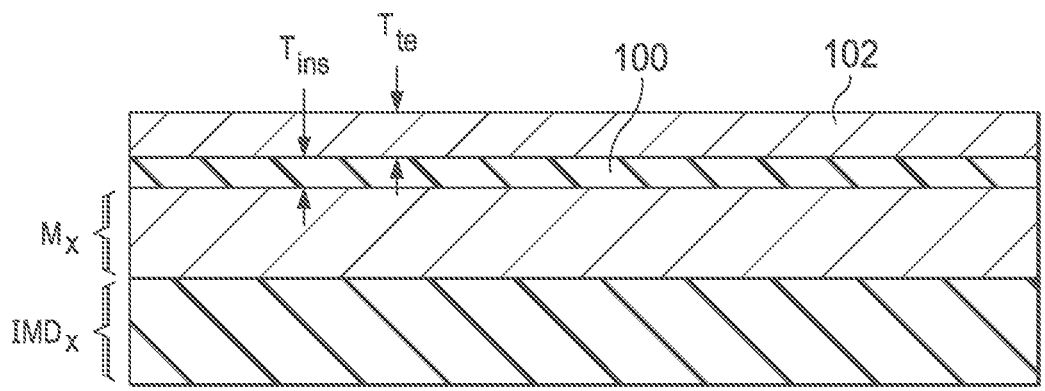
Figure 1C:
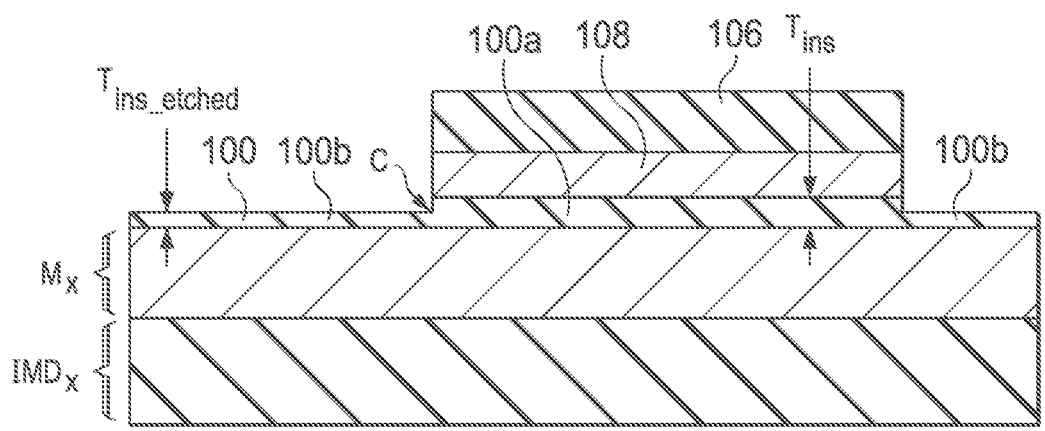
Figure 1D:
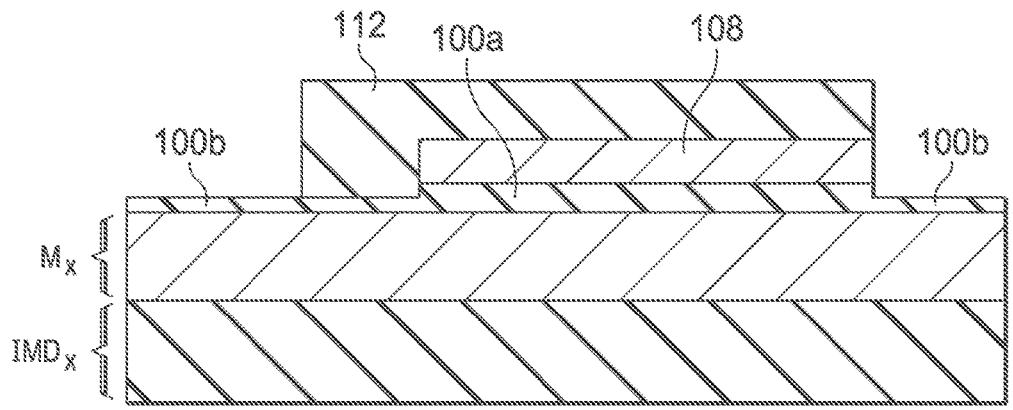
Figure 1E:
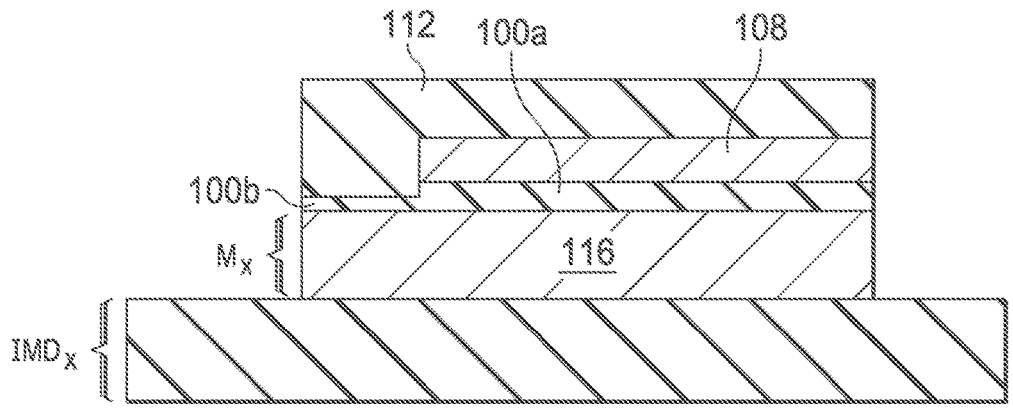

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

The present disclosure provides an MIM capacitor module formed between (and including) two metal layers in an integrated circuit structure. The MIM capacitor module includes a bottom electrode base formed in a lower metal layer $M_x$, a bottom electrode conductively coupled to the bottom electrode base, a planar insulator formed over the bottom electrode, a top electrode formed in an upper metal layer $M_{x+1}$ over the insulator, a bottom electrode connection element formed in the upper metal layer $M_{x+1}$, and a bottom electrode contact conductively connecting the bottom electrode connection element to the bottom electrode base. The bottom electrode includes a cup-shaped bottom electrode component and a bottom electrode fill component formed in an interior opening defined by the cup-shaped bottom electrode component.

The bottom electrode may be formed by a damascene process, including forming a tub opening, depositing a conformal metal layer (e.g., tungsten) that forms the cup-shaped bottom electrode component in the tub opening, depositing a fill metal (e.g., titanium nitride) to form the bottom electrode fill component in the interior opening of the cup-shaped bottom electrode component, and performing a planarization process (e.g., CMP process) to (a) remove upper portions of the conformal metal layer and fill metal and (b) define a planarized insulator support surface at the top of the bottom electrode.

The planar insulator may then be formed on the planarized insulator support surface, and may have a uniform thickness across a full lateral width of the insulator, which may provide an improved capacitor breakdown voltage as compared with certain conventional capacitors. In addition, by forming the bottom electrode from refractory metals, e.g., tungsten and titanium nitride, the top surface of the bottom electrode that interfaces the planar insulator may be free of hillocks that are common in certain conventional capacitors (e.g., capacitors using an aluminum bottom electrode), which may provide a higher and more consistent capacitor breakdown voltage as compared with such conventional capacitors. Also, the top electrode and the bottom electrode may each have a substantial thickness, e.g., a thickness of at least 4000 Å, which may provide improved performance in particular applications (e.g., RF applications) as compared with certain conventional capacitors having a thinner top electrode and/or bottom electrode.

As mentioned above, the MIM capacitor module is formed between (and including) two metal layers, in particular a lower metal layer $M_x$ (in which the bottom electrode base is formed) and an upper metal layer $M_{x+1}$ (in which the top electrode and bottom electrode connection element are formed). As used herein, a "metal layer," for example in the context of the lower metal layer $M_x$ and upper metal layer $M_{x+1}$, may comprise any metal or metalized layer or layers, including:

(a) a metal interconnect layer, e.g., comprising aluminum, copper, or other metal formed by a damascene process or deposited by a subtractive patterning process (e.g., deposition, patterning, and etching of a metal layer), or (b) a silicided polysilicon layer including a number of silicided polysilicon structures (i.e., polysilicon structures having a metal silicide layer formed thereon), for example a silicided polysilicon gate of a metal-oxide-semiconductor field-effect transistor (MOSFET).

Figure 2A:
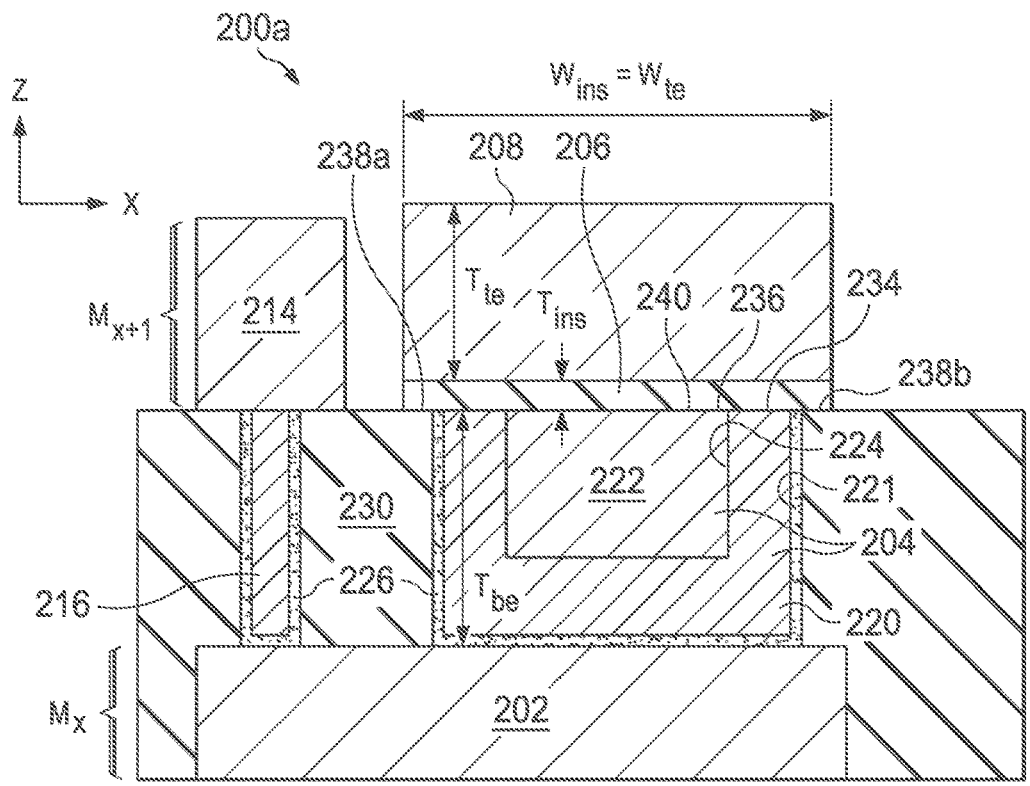
FIG. 2A is a cross-sectional side view an example MIM capacitor module formed between two metal interconnect layers in an integrated circuit structure, according to one example.
Figure 2B:
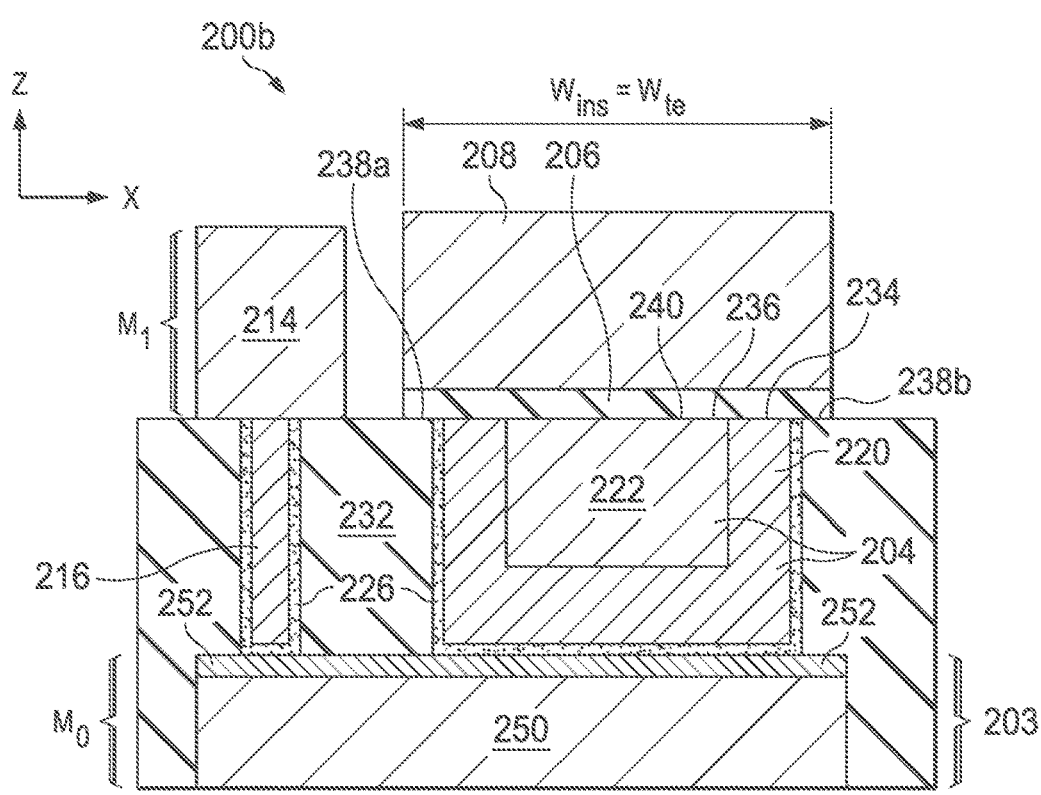
FIG. 2B is a cross-sectional side view an example MIM capacitor module formed between a silicided polysilicon layer and a first metal interconnect layer in an integrated circuit structure, according to one example.

For example, as shown in FIG. 2A, an MIM capacitor module may be constructed between two adjacent metal interconnect layers $M_x$ and $M_{x+1}$ at any depth in an integrated circuit structure. As another example, as shown in FIG. 2B, an MIM capacitor module may be constructed between a silicided polysilicon layer and a first metal interconnect layer (commonly referred to as the metal-1 layer), wherein the silicided polysilicon layer defines the lower metal layer $M_x$ where x=0 (i.e., $M_0$) and the first metal interconnect layer (Metal-1 layer) defines the upper metal layer $M_{x+1}$ (i.e., $M_1$).

FIG. 2A is a cross-sectional side view an example MIM capacitor module 200a formed between (and including portions of) two metal interconnect layers $M_x$ and $M_{x+1}$ in an integrated circuit structure, according to one example. The example MIM capacitor module 200a includes (a) a bottom electrode base 202 formed in a lower metal interconnect layer $M_x$, (b) a bottom electrode 204 conductively coupled to the bottom electrode base 202, (c) a planar insulator 206 formed over the bottom electrode 204, and (d) a top electrode 208 formed in an upper metal interconnect layer $M_{x+1}$ over the planar insulator 206. The MIM capacitor module 200a also includes a bottom electrode connection element 214 formed in the upper metal interconnect layer $M_{x+1}$, and a bottom electrode contact 216 conductively connecting the bottom electrode connection element 214 to the bottom electrode base 202.

Metal interconnect layers $M_x$ and $M_{x+1}$ may be formed from aluminum, copper, or other suitable interconnect metal. Thus, bottom electrode base 202 formed in metal interconnect layer $M_x$, and top electrode 208 and bottom electrode connection element 214 formed in the upper metal interconnect layer $M_{x+1}$, may be formed from aluminum, copper, or other suitable interconnect metal.

The bottom electrode 204 includes (a) a cup-shaped bottom electrode component 220 formed in a tub opening 221 in a dielectric region 230, e.g., an oxide inter-metal dielectric (IMD) region, and (b) a bottom electrode fill component 222 formed in an interior opening 224 defined by the cup-shaped bottom electrode component 220. The bottom electrode 204 may be formed using a damascene process, as described in more detail below with reference to FIGS. 4A-4B through 7A-7B. The cup-shaped bottom electrode component 220 may be formed from a conformal metal, e.g., tungsten. The bottom electrode fill component 222 may be formed from a "fill metal" that may be different than the conformal metal that forms the cup-shaped bottom electrode component 220. For example, the fill metal forming the bottom electrode fill component 222 may comprise TiN or other refractory metal different than the conformal metal forming the cup-shaped bottom electrode component 220.

In some examples, the bottom electrode contact 216 and the cup-shaped bottom electrode component 220 may be formed simultaneously by deposition of tungsten or other conformal metal, as discussed below with reference to FIG. 5. In some examples, an adhesive layer 226 (e.g., a TiN layer with a thickness in the range of 50-300 Å) is deposited prior to the conformal metal (forming bottom electrode contact 216 and cup-shaped bottom electrode component 220) to improve adhesion between the conformal metal and dielectric region 230, in particular in the tub opening 221.

In some examples, the bottom electrode contact 216 is formed as a via, and may also be referred to as a bottom electrode via. For example, as discussed below with reference to FIGS. 4A-5, the bottom electrode contact 216 may be formed as a via, simultaneous with interconnect vias formed in the dielectric region 230 (IMD region) at locations distinct from the MIM capacitor module 200a.

As shown in FIG. 2A, the planar insulator 206 may be formed on a planarized insulator support surface 240. The planarized insulator support surface 240, which may be formed by a chemical mechanical planarization (CMP) or other planarization process, includes a planarized top surface 234 of the cup-shaped bottom electrode component 220, a planarized top surface 236 of the bottom electrode fill component 222, and planarized top surface areas 238a and 238b of the dielectric region 230 on opposite lateral sides of the bottom electrode 204 (in the x-direction, or in both the x-direction and y-direction).

Figure 1F:
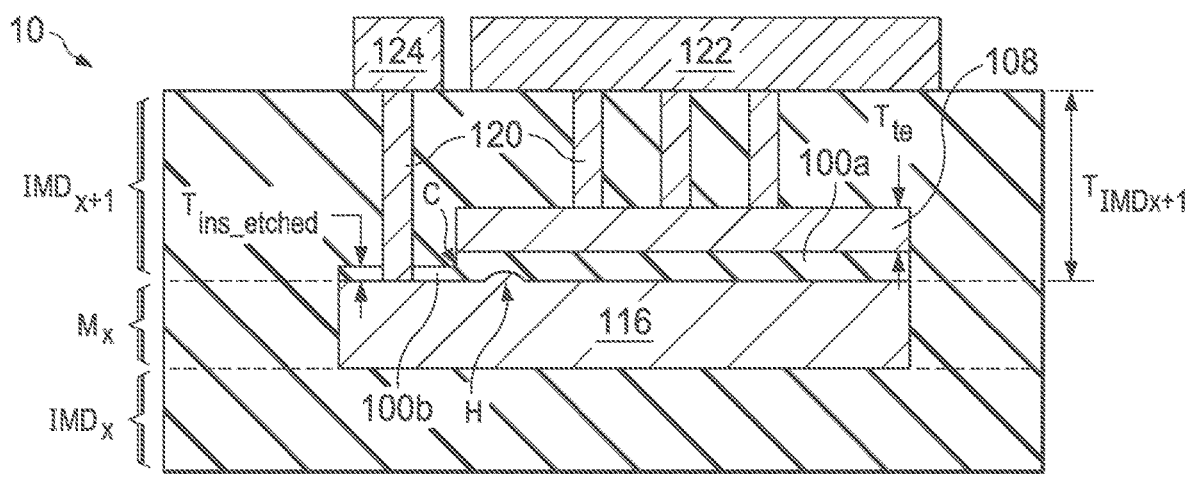

The planarized insulator support surface 240 may free of metal hillocks, as the bottom electrode 204 is formed from refractory metals (e.g., tungsten and titanium nitride) which resist the formation of hillocks, unlike the aluminum bottom electrode of the example prior art MIM capacitor module 10 shown in FIG. 1F discussed above. Forming the planar insulator 206 on a surface free of hillocks may provide a higher and more consistent capacitor breakdown voltage, e.g., as compared with a conventional capacitor having a bottom electrode including hillocks.

The surface roughness of the planarized insulator support surface 240 may depend on the specific process parameters implemented (e.g., CMP process parameters). In some examples, the planarized insulator support surface 240 has a root-mean-square (RMS) surface roughness of less than 50 Å. In some examples, the planarized insulator support surface 240 has an RMS surface roughness of less than 20 Å.

Figure 11:
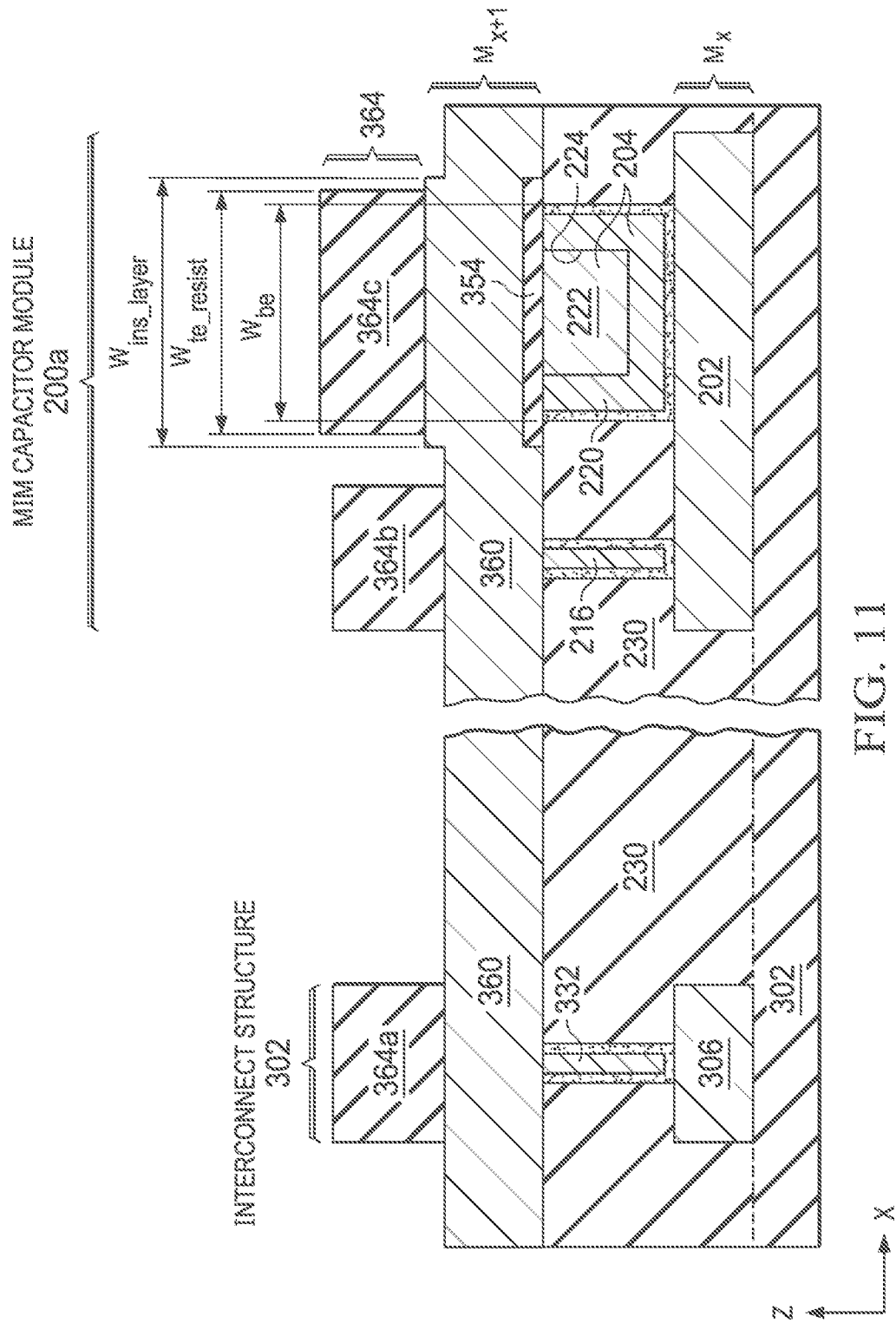

The planar insulator 206 may be formed directly on the planarized insulator support surface 240. The width $W_{ins}$ of the planar insulator 206 in the x-direction may be coextensive with the width $W_{te}$ of the overlying top electrode 208, as a result of an anisotropic metal etch extending through both the top electrode 208 and planar insulator 206, e.g., as shown in FIG. 11 discussed below.

In some examples, e.g., as shown in FIG. 2A, the top electrode 208 and planar insulator 206 are formed with a greater width ($W_{te}$, $W_{ins}$) than the underlying bottom electrode 204 in the x-direction, such that the planar insulator 206 extends across and beyond the full lateral width of the bottom electrode 204 and onto the planarized top surface areas 238a and 238b of dielectric region 230 on opposite sides of the bottom electrode 204 in the x-direction. In other words, the planar insulator 206 extends across the planarized top surface 234 of the cup-shaped bottom electrode component 220, the planarized top surface 236 of the bottom electrode fill component 222, and the planarized top surface areas 238a and 238b of the dielectric region 230. In some examples, the planar insulator 206 extends laterally across the full lateral width of the bottom electrode 204 in both the x-direction and y-direction, and additionally extends over portions of the dielectric region 230 on all lateral sides of the bottom electrode 204, such that a perimeter of the planar insulator region 206 surrounds a perimeter of the bottom electrode 204, from a top view.

The planar insulator 206 has a uniform thickness $T_{ins}$ across the full lateral width $W_{ins}$ of the planar insulator 206. For example, in some examples the thickness $T_{ins}$ of the insulator layer 206 varies by less than 10% across the full lateral width $W_{ins}$ of the planar insulator 206. In some implementations the thickness $T_{ins}$ of the insulator layer 206 varies by less than 5%, or even less than 1%, across the full lateral width $W_{ins}$ of the planar insulator 206.

This uniform thickness $T_{ins}$ across the full lateral width $W_{ins}$ of the planar insulator 206 may provide an increased and predictable breakdown voltage for the resulting MIM capacitor module 200, e.g., as compared with a capacitor having a partially etched thickness or otherwise varying thickness, e.g., the prior art MIM capacitor 10 shown in FIG. 1F and discussed above.

Further, by forming the bottom electrode 204 between two metal layers $M_x$ and $M_{x+1}$ the bottom electrode 204 may have a thickness $T_{be}$ extending across the full thickness of the dielectric region 230 between the metal layers $M_x$ and $M_{x+1}$. In addition, by forming the top electrode 208 from the metal interconnect layer $M_{x+1}$, the top electrode 208 may have a thickness $T_{te}$ defined by the thickness of the metal interconnect layer $M_{x+1}$. Thus, the bottom electrode thickness $T_{be}$ and top electrode thickness $T_{te}$ may be sufficient to provide target performance characteristics for various applications (e.g., including RF applications), as compared with certain conventional capacitors having a thinner top electrode and/or bottom electrode. In some examples, the bottom electrode thickness $T_{be}$ may be at least 4000 Å, and the top electrode thickness $T_{te}$ may be at least 4000 Å.

FIG. 2B is a cross-sectional side view an example MIM capacitor module 200b formed between (and including portions of) a silicided polysilicon layer and a first metal interconnect layer (commonly referred to as the metal-1 layer), according to one example. In this example, the silicided polysilicon layer defines a lower metal layer $M_0$ (i.e., lower metal layer $M_x$ where x=0) and the first metal interconnect layer (Metal-1) defines an upper metal layer $M_1$.

MIM capacitor module 200b is similar to MIM capacitor module 200a shown in FIG. 2A and discussed above, except the MIM capacitor module 200b is formed between the silicided polysilicon layer $M_0$ and first metal interconnect layer $M_1$, rather than between two metal interconnect layers $M_x$ and $M_{x+1}$.

MIM capacitor module 200b includes (a) a bottom electrode base 203 formed in the silicided polysilicon layer $M_0$, (b) a bottom electrode 204 including a cup-shaped bottom electrode component 220 and a bottom electrode fill component 222, (c) a planar insulator 206 formed over the bottom electrode 204, (d) a top electrode 208 and a bottom electrode connection element 214 formed in the first metal interconnect layer $M_1$, and (e) a bottom electrode contact 216 conductively connecting the bottom electrode connection element 214 to the bottom electrode base 203. The bottom electrode 204 and bottom electrode contact 216 are formed in dielectric region 232, e.g., a pre-metal dielectric (PMD) region.

As shown in FIG. 2B, the bottom electrode base 203 is formed by a silicided polysilicon structure including a metal silicide layer 252 formed on a top surface of a polysilicon structure 250. The metal silicide layer 252 may comprise any suitable metal silicide layer, for example titanium silicide (TiSi2), cobalt silicide (CoSi2), or nickel silicide (NiSi), having a thickness in the range of 100-300 Å or other suitable thickness. The cup-shaped bottom electrode component 220 and bottom electrode contact 216 may be formed on the metal silicide layer 252. The metal silicide layer 252 provides a conductive connection between the bottom electrode 204 and the bottom electrode contact 216.

FIGS. 3-12 are cross-sectional side views showing an example process for forming an example integrated circuit structure 300 including the example MIM capacitor module 200a of FIG. 2A along with a nearby interconnect structure 302, according to one example.

Figure 3:
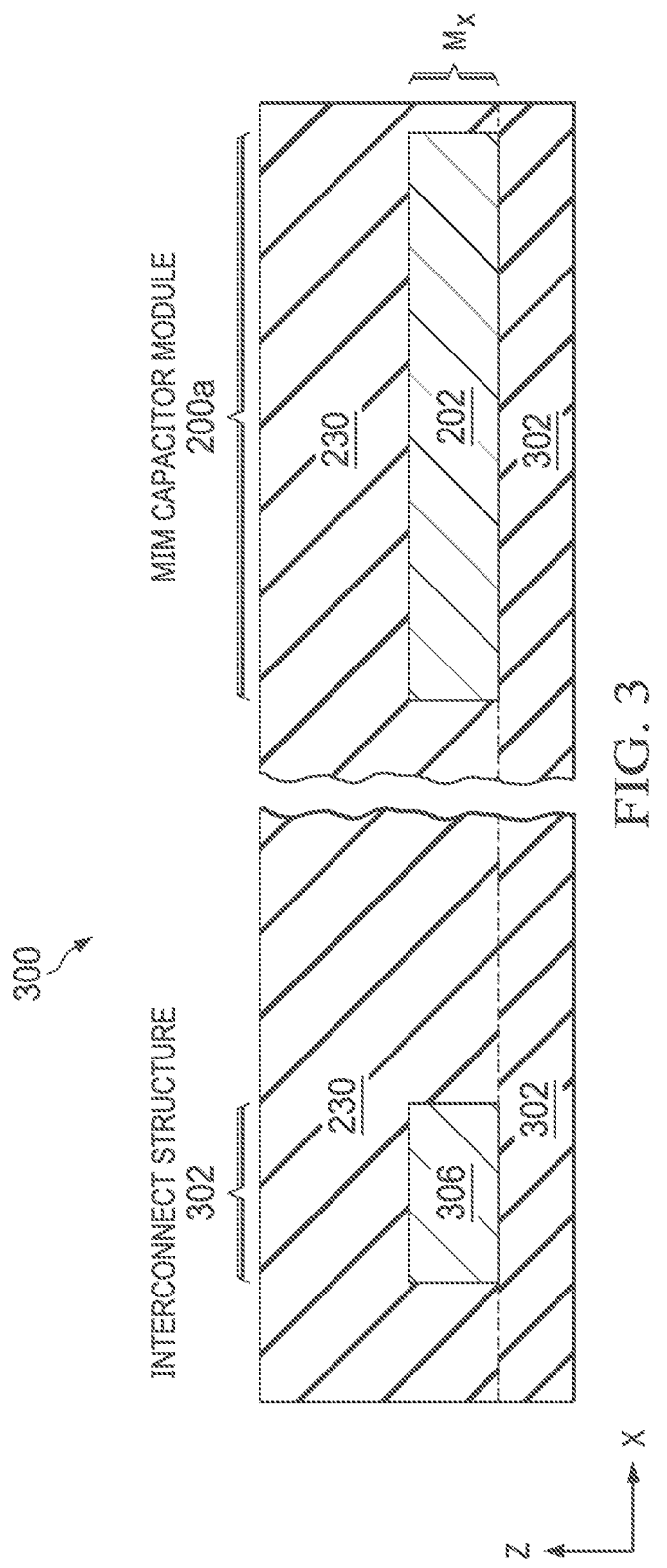
FIGS. 3-12 are cross-sectional side views showing an example process of forming an integrated circuit structure including the example MIM capacitor module shown in FIG. 2A along with an example interconnect structure.

First, as shown in FIG. 3, a lower metal interconnect layer $M_x$ is formed over a dielectric region 304, e.g., a pre-metal dielectric (PMD) region or inter-metal dielectric (IMD) region. Metal layer $M_x$ may be formed from aluminum, copper, or other suitable metal. Metal layer $M_x$ may be deposited, patterned, and etched to form (a) the bottom electrode base 202 for the MIM capacitor module 200a and (b) a lower interconnect element 306. Alternatively, the bottom electrode base 202 and lower interconnect element 306 may be formed by a damascene process. Each of bottom electrode base 202 and lower interconnect element 306 may comprise a wire or other laterally elongated structure (e.g., elongated in the y-axis direction), or a discrete pad (e.g., having a square, circular, or substantially square or circular shape in the x-y plane), or any other suitable shape and structure.

A resist strip may be performed to remove remaining portions of the photomask used for patterning the metal layer $M_x$. An IMD region 230 may be formed over metal layer $M_x$, e.g., by performing an oxide deposition (e.g., using high density plasma (HDP) and PECVD processes) followed by a CMP process to planarize the oxide.

Figure 4B:
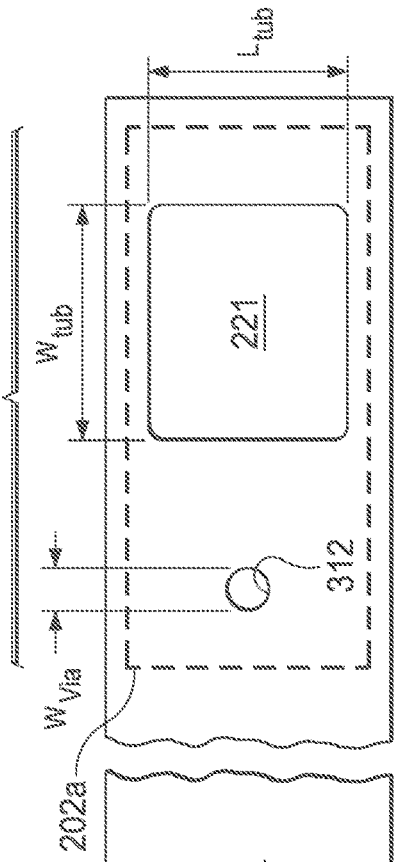
Figure 4A:
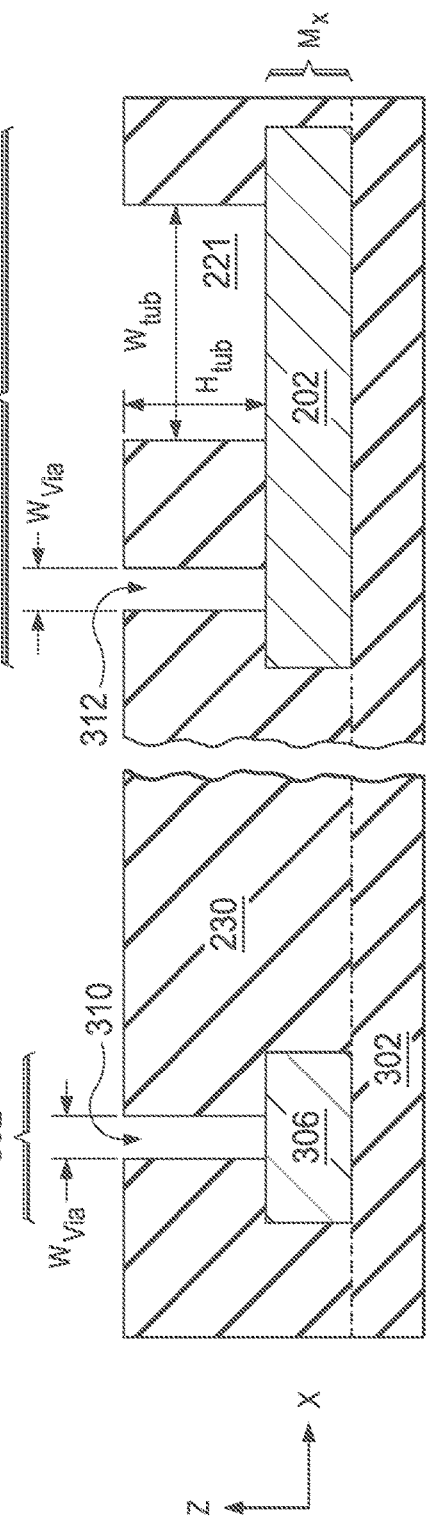

Next, as shown in FIG. 4A (cross-sectional side view) and corresponding FIG. 4B (top view), the IMD region 230 is patterned and etched (e.g., using a plasma etch) to concurrently form (a) at least one interconnect via opening 310 for various interconnect structures, (b) a bottom electrode contact opening 312, and (c) the tub opening 221 for forming the bottom electrode 204 of the MIM capacitor module 200. The interconnect via opening 310 and bottom electrode contact opening 312 may each be formed as a narrow via opening with a lateral diameter or width $W_{via}$. In contrast, the tub opening 221 may have a substantially larger width (x-direction) and/or length (y-direction) than the narrow via openings 310 and 312. The shape and dimensions of the tub opening 221 may be selected based on various parameters, e.g., for effective manufacturing of the MIM capacitor module 200 (e.g., effective deposition of the bottom electrode materials (e.g., tungsten and TiN) into the tub opening 221) and/or for desired performance characteristics of the resulting MIM capacitor module 200. In some examples, the tub opening 221 may have a square or rectangular shape from a top view, e.g., as shown in FIG. 4B. In other examples, the tub opening 221 may have a circular or oval shape from the top view.

As noted above, an x-direction width $W_{tub}$ and/or y-direction length $L_{tub}$ of the tub opening 221 may be substantially larger than the width $W_{via}$ of each via opening. For example, in some embodiments, the width $W_{tub}$ and/or length $L_{tub}$ of the tub opening 221 is at least twice as large as the width $W_{via}$ of each via opening. In particular embodiments, the width $W_{tub}$ and/or length $L_{tub}$ of the tub opening 221 is at least five time as large as the width $W_{via}$ of each via opening. In some examples, the width $W_{via}$ of each via opening is in the range of 0.1-0.5 µm, whereas the width $W_{tub}$ and length $L_{tub}$ of the tub opening 221 are each the range of 1-100 µm.

After the etch to create the openings 310, 312, and 221, any remaining photoresist material may be removed by a resist strip.

Figure 5:
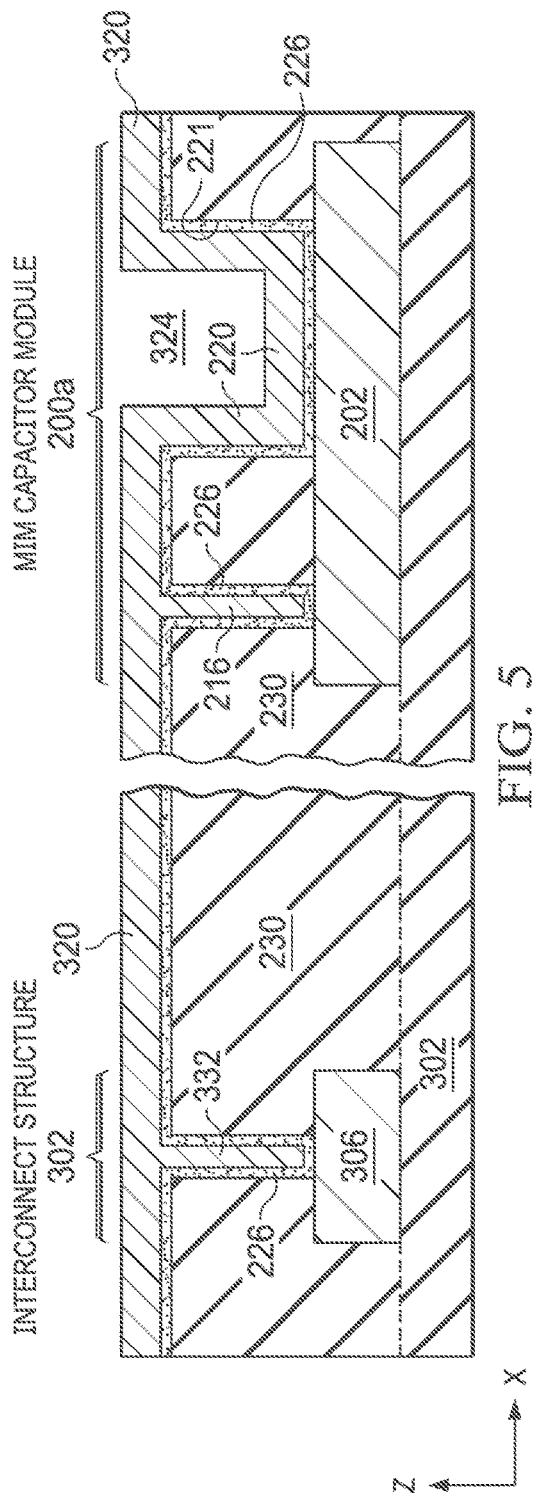

Next, as shown in FIG. 5, adhesive layer 226 (e.g., comprising titanium nitride, TiN) is deposited over the integrated circuit structure 300 and into the openings 310, 312, and 221, e.g., with a thickness in the range of 50-300 Å. A conformal metal layer 320, e.g., tungsten (W), is then deposited over adhesive layer 226, e.g., by Chemical Vapor Deposition (CVD) deposition, with a thickness in the range of 1000-5000 Å. As shown, the conformal metal layer 320 (a) fills the interconnect via opening 310 to form an interconnect via 332, (b) fills the bottom electrode contact opening 312 to form the bottom electrode contact 216, and (c) partially fills the tub opening 221 to form the cup-shaped bottom electrode component 220 in the tub opening 221. The cup-shaped bottom electrode component structure 220 defines an interior opening 324. The interconnect via 332, bottom electrode contact 216, and cup-shaped bottom electrode component 220 are further processed as discussed below, including a CMP process shown in FIG. 7A, which defines a final form of each respective element 332, 216, and 220.

The deposited conformal metal layer 320 layer may have high tensile stresses, due to inherent material properties of the conformal metal, e.g., tungsten. As a result, a deposition thickness above about 5000 Å (e.g., a thickness of 7000 Å) may result in a cracking or peeling of the conformal metal layer 320, or a warping or breakage of the underlying silicon wafer (not shown), e.g., during a subsequent CMP process.

Figure 6:
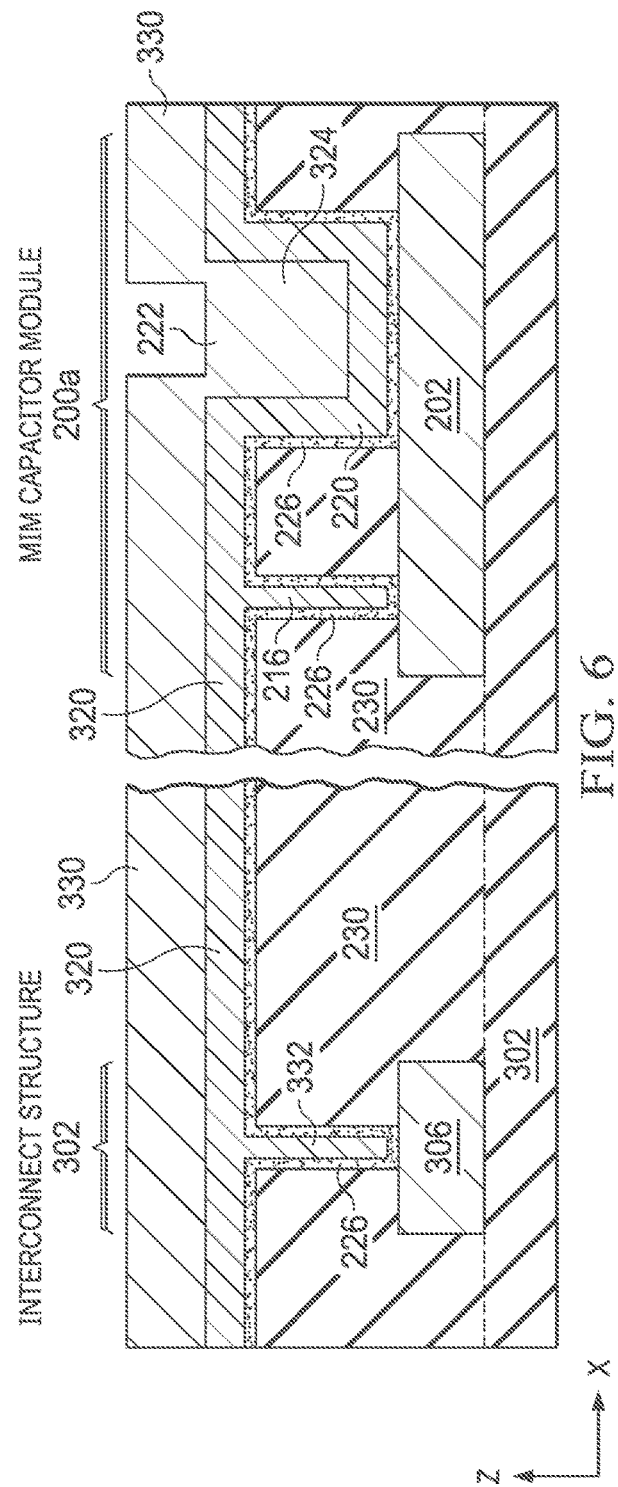

Next, as shown in FIG. 6, a fill metal layer 330 is deposited over the integrated circuit structure 300 and extending down into the interior opening 324 of the cup-shaped bottom electrode component structure 220. The fill metal layer 330 may deposited with sufficient thickness to fill the interior opening 324 at least to the top of the adjacent dielectric region 230. The fill metal layer 330 may be deposited by a reactive PVD or CVD process without generating hillocks, which may provide an increased breakdown voltage for the resulting MIM capacitor module 200a, as compared with prior art designs that enable or encourage hillock formation on the capacitor bottom electrode (and/or other capacitor components), e.g., as discussed above regarding the example prior art capacitor shown in FIG. 1F.

In some examples, the fill metal layer 330 comprises titanium nitride (TiN) or other refractory metal (different from the conformal metal of the conformal metal layer 320) that has inherent compressive stresses (e.g., for a layer thickness of less than 1 μm). The inherent compressive stresses of the fill metal layer 330 may counteract the inherent tensile stresses of the underlying conformal metal layer 320 (e.g., tungsten layer), to thereby reduce the risk of inter-layer peeling, silicon wafer breakage, or other mechanical failure. In another example, the fill metal layer 330 is formed by aluminum, which may provide reduced resistance for the resulting bottom electrode 204, as described in relation to FIG. 2A, but may introduce the possibility of hillock formation.

Figure 7B:
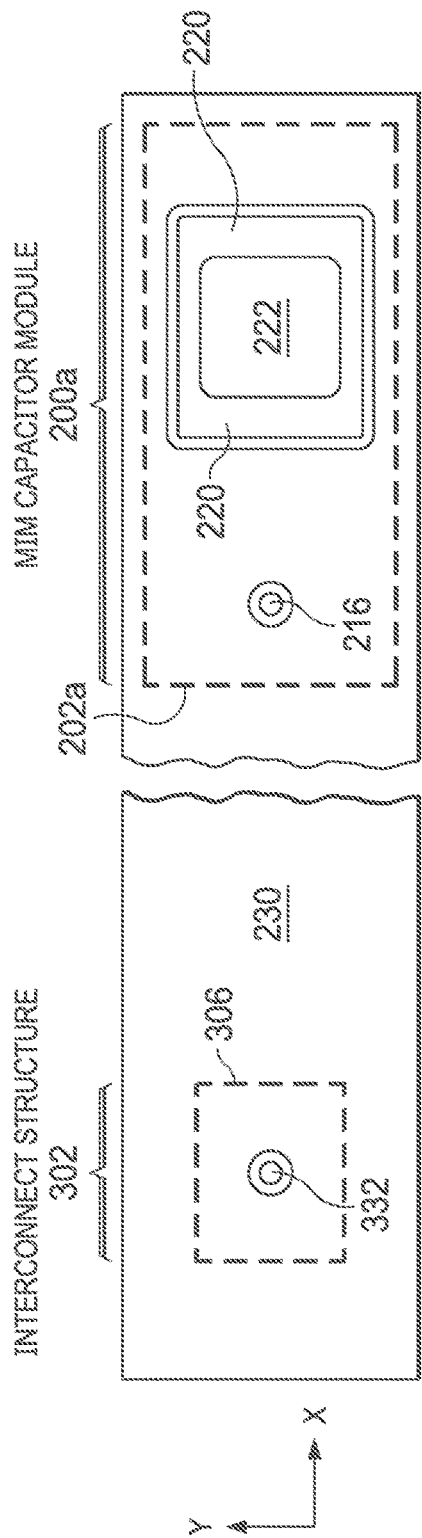
Figure 7A:
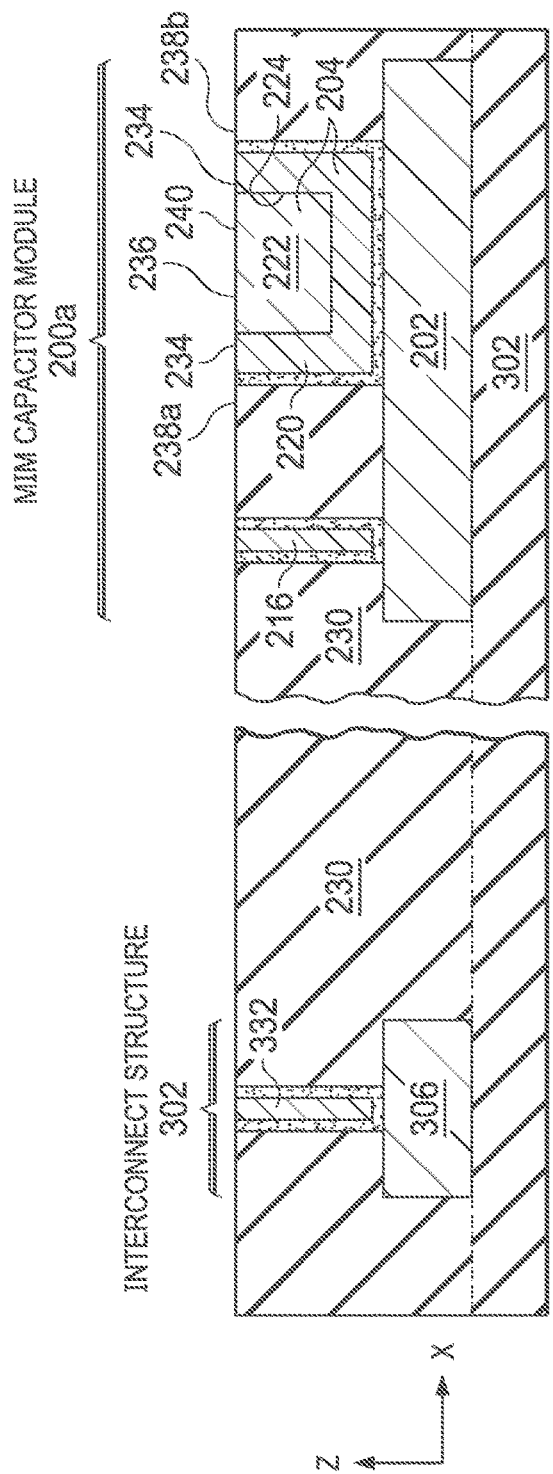

Next, as shown in FIG. 7A (cross-sectional side view) and corresponding FIG. 7B (top view), a planarization process (e.g., CMP process) is performed to remove upper portions of the fill metal layer 330, the conformal metal layer 320, and adhesive layer 226, and thereby define the final form of the interconnect via 332, bottom electrode contact 216, cup-shaped bottom electrode component 220, and bottom electrode fill component 222. The planarization process may be designed to stop on the dielectric region 230. As discussed above, the cup-shaped bottom electrode component 220 and the bottom electrode fill component 222 collectively define the bottom electrode 204 of the MIM capacitor module 200a.

The planarization process (e.g., CMP process) defines a polished, planarized insulator support surface 240 for supporting the planar insulator 206, which is formed as discussed below. As shown in FIG. 7A, the planarized insulator support surface 240 includes a planarized top surface 234 of the cup-shaped bottom electrode component 220, a planarized top surface 236 of the bottom electrode fill component 222, and planarized top surface areas 238a, 238b of the dielectric region 230 on opposite sides of the bottom electrode 204. The planarized insulator support surface 240 provides a smooth, planarized surface free of hillocks, which is suitable for forming the planar insulator 206 thereon, as discussed below. For example, the planarized top surface 234 of the cup-shaped bottom electrode component 220 and the planarized top surface 236 of the bottom electrode fill component 222 provide smooth, planarized surfaces of refractory metals (e.g., tungsten and titanium nitride, as discussed above) that are free of hillocks, suitable for forming the planar insulator 206 thereon.

Figure 8:
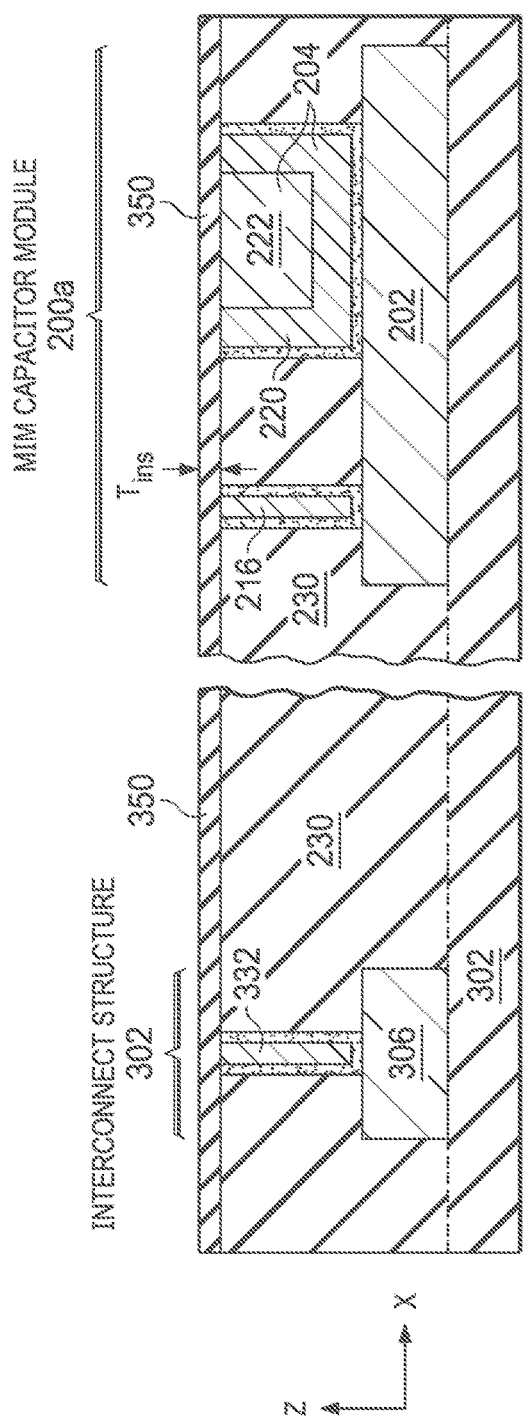

Next, as shown in FIG. 8, an insulator layer 350 is deposited over the structure 300. The insulator layer 350 may comprise silicon nitride ($Si_3N_4$, κ~7) deposited with a thickness $T_{ins}$ in the range of 400-600 Å, for example by a PECVD deposition process. In other examples, the insulator layer 350 may comprise silicon oxide ($SiO_2$) or a high-k dielectric material, e.g., $Al_2O_3$ (κ~10), $Ta_2O_5$ (κ~25), $HfO_2$ (κ~22), or $ZrO_2$ (κ~35), e.g., deposited by a PECVD deposition process or an ALD (atomic layer deposition) process.

Figure 9:
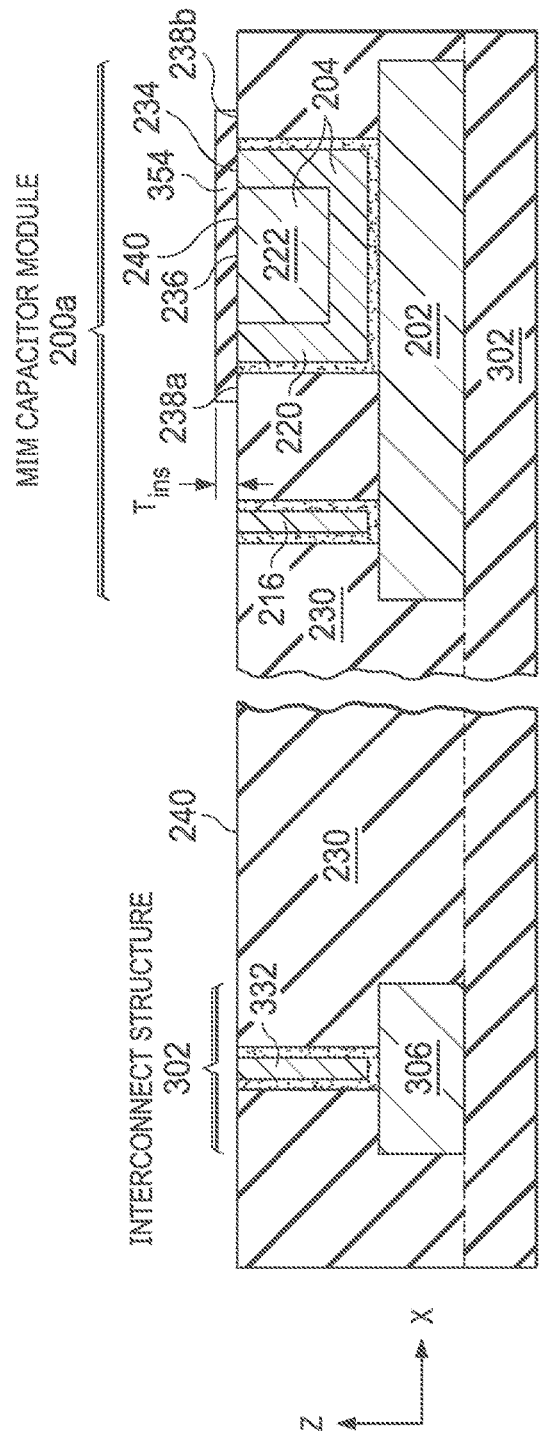

Next, as shown in FIG. 9, the insulator layer 350 is patterned and etched to leave an insulator layer region 354 over the bottom electrode 204. The insulator layer region 354 extends laterally across the full lateral width of the bottom electrode 204, in the x-direction, and additionally extends over a portion of the dielectric region 230 on each lateral side of the bottom electrode 204. In some examples, insulator layer region 354 extends laterally across the full lateral width of the bottom electrode 204, in both the x-direction and y-direction, and additionally extends over portions of the dielectric region 230 on all lateral sides of the bottom electrode 204, such that a perimeter of the insulator layer region 354 surrounds a perimeter of the bottom electrode 204, from a top view.

The insulator layer 350 may be etched using a relatively simple dielectric etch, in contrast with prior art processes that involve a difficult top electrode metal etch. As shown, the thickness $T_{ins}$ of the insulator layer 350 remains uniform across the full lateral width (x-direction) of the insulator layer region 354.

Figure 10:
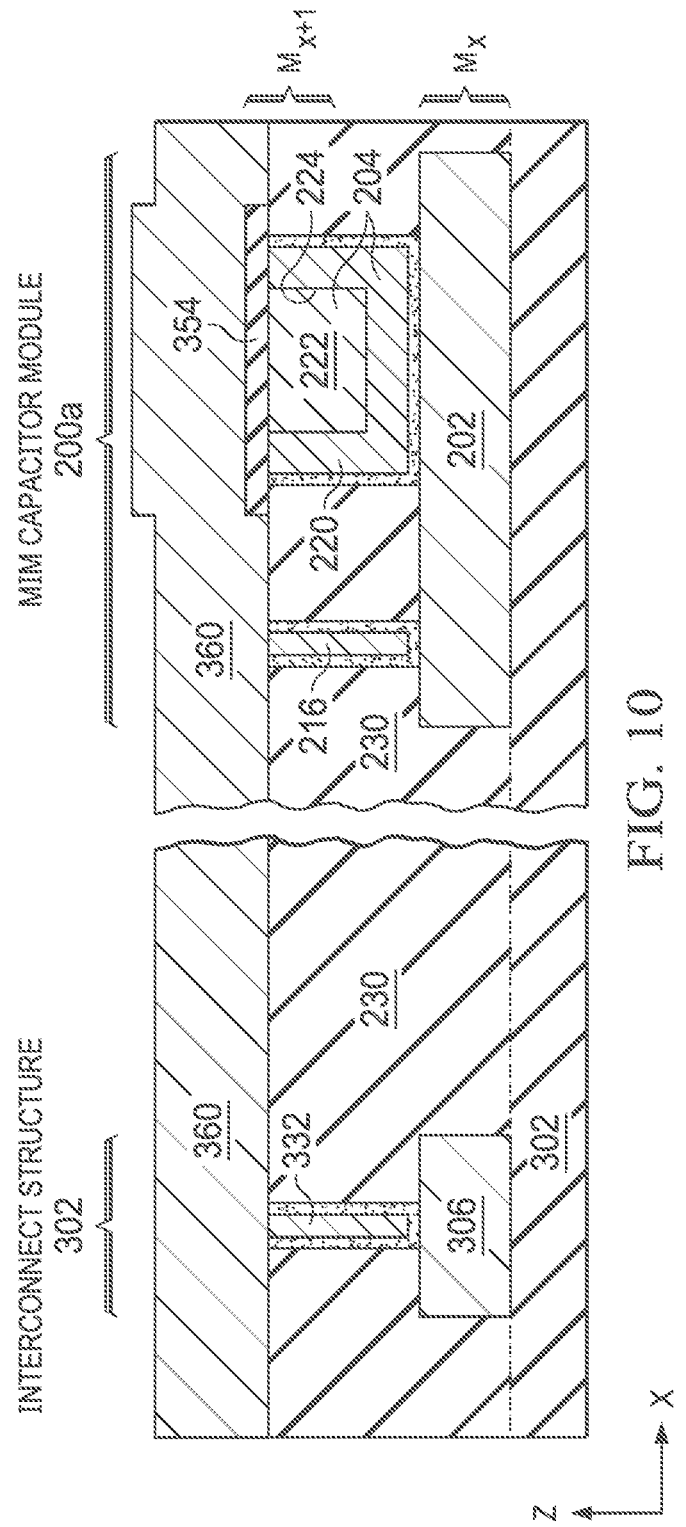

An upper metal interconnect layer $M_{x+1}$ is them formed over the integrated circuit structure 300. First, as shown in FIG. 10, an upper metal layer 360, e.g., aluminum comprising aluminum, copper, or other suitable metal, is deposited over the dielectric region 230 and the remaining portion of insulator layer region 354.

Next, as shown in FIG. 11, a photoresist layer is deposited and patterned to form a photomask 364 including a first photomask element 364a for forming an upper interconnect element 370, as discussed below), a second photomask element 364b (for forming the bottom electrode connection element 214, as discussed below), and a third photomask element 364c (for forming the top electrode 208 of the MIM capacitor module 200, as discussed below). As shown, a width $W_{te\_resist}$ of the third photomask element 364c may be larger than a width $W_{be}$ of the bottom electrode 204 but smaller than the width $W_{ins\_layer}$ of the insulator layer region 354, such that the subsequent metal etch to form the top electrode 208 (see FIG. 12, discussed below) self-aligns the lateral edges (in the x-direction) of the top electrode 208 with the underlying planar insulator 206 resulting from insulator layer region 354, while also preventing any etching of the bottom electrode 204.

Figure 12:
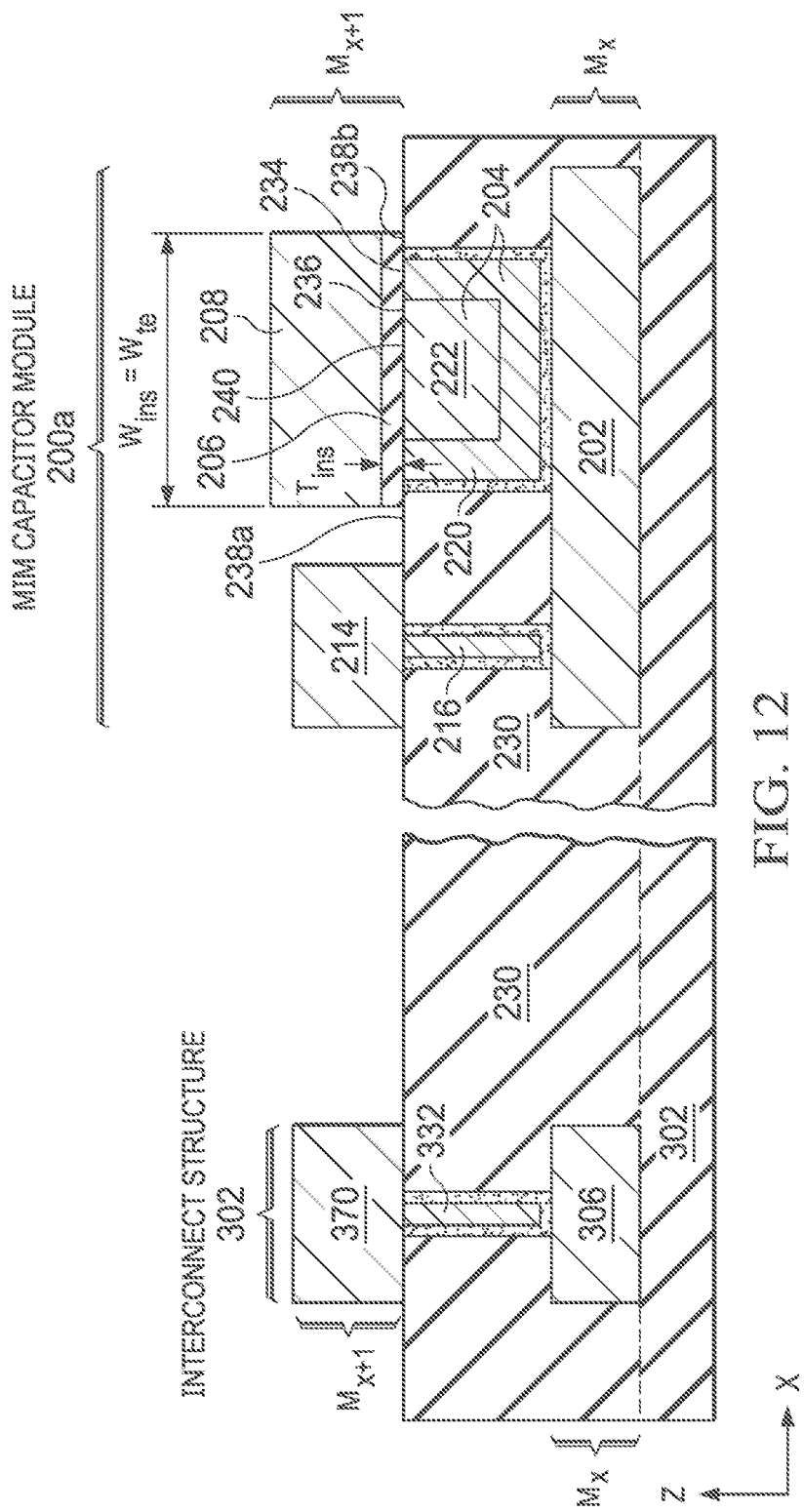

FIG. 12 shows the results of the metal etch through the photomask 364 shown in FIG. 11, and after removal of the photomask 364, e.g., by a resist strip process. The etch may be selective to etch through portions of the upper metal layer 360 and underlying insulator layer region 354 not covered by the photomask 364 (see FIG. 11), but stop in the dielectric region 230, e.g., at a depth of 500-1000 Å into the dielectric region 230. As shown, the etch forms (a) the upper interconnect element 370 in contact with the interconnect via 332, (b) the bottom electrode connection element 214 in contact with the bottom electrode contact 216, and (c) the top electrode 208 over a remaining portion of the insulator layer region 354, which defines the planar insulator 206. As shown, the lateral edges of the top electrode 208 are aligned with the underlying planar insulator 206, as a result of the metal etch.

In the illustrated example, the planar insulator 206 extends laterally across the full lateral width $W_{be}$ of the bottom electrode 204, in the x-direction, and additionally extends over a portion of the dielectric region 230 on each lateral side of the bottom electrode 204 (in the x-direction). Thus, the width $W_{ins}$ of planar insulator 206 extends over the planarized top surface 234 of the cup-shaped bottom electrode component 220, the planarized top surface 236 of the bottom electrode fill component 222, and the planarized top surface areas 238a and 238b of the dielectric region 230 on opposite sides of the bottom electrode 204. Thus, the width $W_{ins}$ of planar insulator 206 is larger than the width $W_{be}$ of the bottom electrode 204. In some examples, the planar insulator 206 extends laterally across the full lateral width of the bottom electrode 204 in both the x-direction and y-direction, and additionally extends over portions of the dielectric region 230 on all lateral sides of the bottom electrode 204, such that a perimeter of the planar insulator region 206 surrounds a perimeter of the bottom electrode 204, from a top view.

By extending across the full lateral width of the bottom electrode 204, the planar insulator protects the underlying bottom electrode 204 from the metal etch of the upper metal layer 360. As discussed above, the insulator layer 206 has a uniform thickness $T_{ins}$ across the full lateral width $W_{ins}$ of the planar insulator 206 (in the x-direction, or in both the x-direction and y-direction). For example, in some examples the thickness $T_{ins}$ of the insulator layer 206 varies by less than 10%, less than 5%, or less than 1% across the full lateral width $W_{ins}$ of the planar insulator 206 (in the x-direction, or in both the x-direction and y-direction).

In some examples, FIG. 12 shows the completed of MIM capacitor module 200a. After forming the MIM capacitor module 200a, the process may continue with construction of additional interconnect structures, e.g., by forming further metal interconnect layers and/or dielectric layers.

Figure 13:
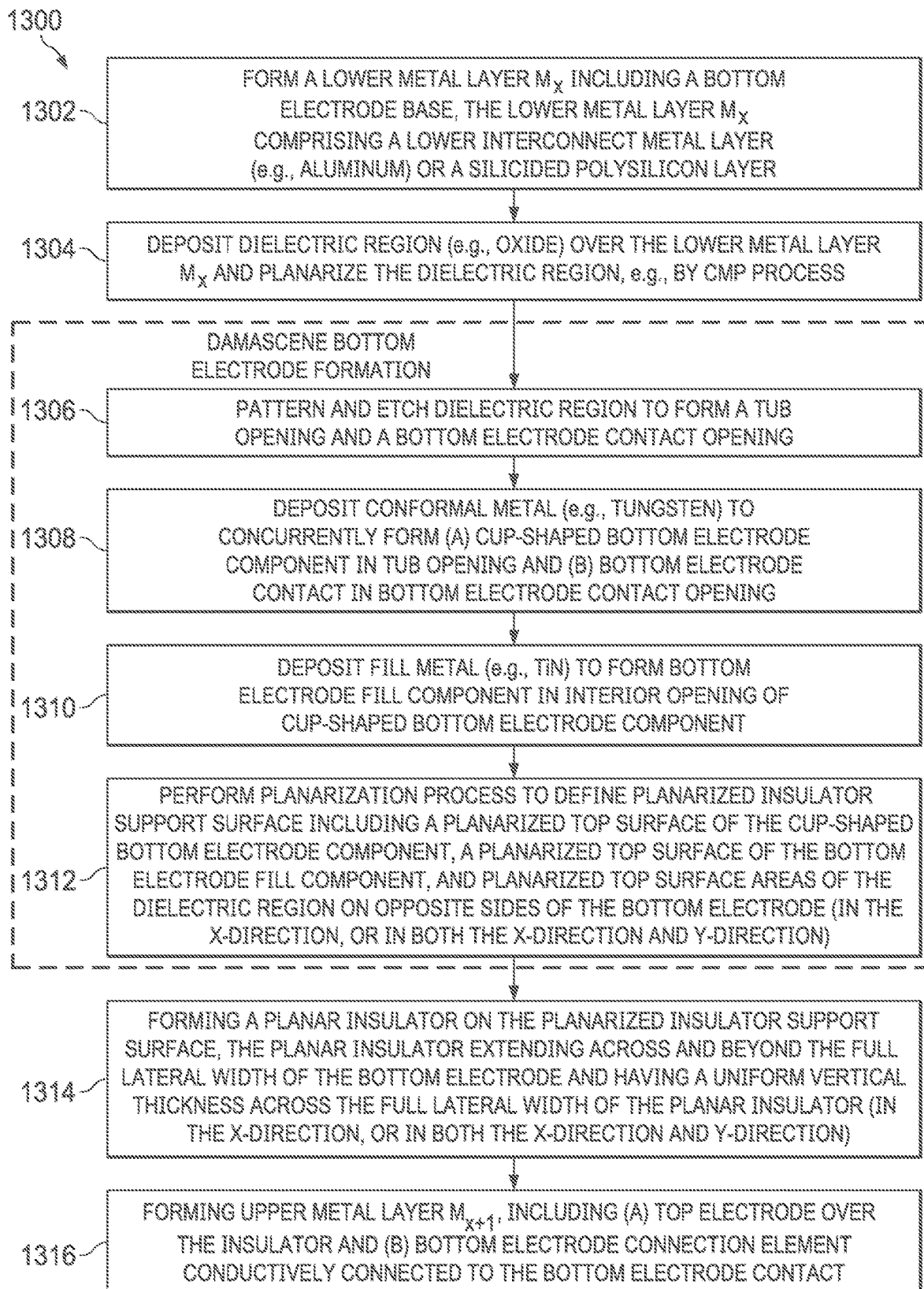
FIG. 13 is a flowchart showing an example method of forming an example MIM capacitor module and interconnect structure in an integrated circuit structure, according to one example.

FIG. 13 is a flowchart showing an example method 1300 of forming an example MIM capacitor module in an integrated circuit structure, according to one example. At 1302, a lower metal layer $M_x$ is formed, including a bottom electrode base. In one example, the lower metal layer $M_x$ comprises a lower interconnect metal layer (e.g., comprising aluminum). In another example, the lower metal layer $M_x$ comprises a silicided polysilicon layer. At 1304, a dielectric region (e.g., an oxide region) is deposited over the lower metal layer $M_x$ and planarized, for example, by a CMP process.

Next, as indicated by the dashed line box in FIG. 13, a damascene process may be performed at 1306-1312 to form a bottom electrode of the MIM capacitor module. First, at 1306, the dielectric region is patterned and etched to form a tub opening and a bottom electrode contact opening. Next, at 1308, a conformal metal (e.g., tungsten) is deposited to concurrently form (a) a cup-shaped bottom electrode component in the tub opening and (b) a bottom electrode contact in the bottom electrode contact opening, wherein each of the cup-shaped bottom electrode component and the bottom electrode contact is conductively coupled to the bottom electrode base.

At 1310, a fill metal (e.g., titanium nitride) is deposited to form a bottom electrode fill component in an interior opening defined by the cup-shaped bottom electrode component. At 1312, a planarization process is performed to define the final form of the cup-shaped bottom electrode component and bottom electrode fill component, and to define a planarized insulator support surface including a planarized top surface of the cup-shaped bottom electrode component, a planarized top surface of the bottom electrode fill component and planarized top surface areas of the dielectric region on opposite sides of the bottom electrode. The cup-shaped bottom electrode component and the bottom electrode fill component collectively define the capacitor bottom electrode.

At 1314, a planar insulator is formed on the planarized insulator support surface. The planar insulator extends across and beyond the full lateral width of the bottom electrode (in the x-direction, or in both the x-direction and y-direction) and may have a uniform vertical thickness across the full lateral width of the planar insulator (in the x-direction, or in both the x-direction and y-direction). At 1316, an upper metal layer $M_{x+1}$ is formed, including (a) a top electrode over the insulator and (b) a bottom electrode connection element conductively connected to the bottom electrode contact. The upper metal layer $M_{x+1}$ may comprise an interconnect metal layer, e.g., a first interconnect metal layer (metal-1 layer) or a higher interconnect metal layer (e.g., comprising aluminum).

FIG. 14 is a flowchart showing an example method 1400 of forming an example integrated circuit structure including an example MIM capacitor module and nearby interconnect structure, according to one example. At 1402, a lower metal layer $M_x$ is formed, including a bottom electrode base and a lower interconnect element. In one example, the lower metal layer $M_x$ comprise a lower interconnect metal layer (e.g., comprising aluminum). In another example, the lower metal layer $M_x$ comprises a silicided polysilicon layer. At 1404, a dielectric region (e.g., an oxide region) is deposited over the lower metal layer $M_x$, and planarized, for example by a CMP process.

Next, as indicated by the dashed line box in FIG. 14, a damascene process may be performed at 1406-1412 to form a bottom electrode and a bottom electrode contact of the MIM capacitor module. First, at 1406, the dielectric region is patterned and etched to form (a) a tub opening and a bottom electrode contact opening over the bottom electrode base and (b) an interconnect via opening over the lower interconnect element.

At 1408, a conformal metal (e.g., tungsten) is deposited to concurrently form (a) a cup-shaped bottom electrode component in the tub opening, (b) a bottom electrode contact in the bottom electrode contact opening, and (c) an interconnect via in the interconnect via opening.

At 1410, a fill metal (e.g., titanium nitride) is deposited to form a bottom electrode fill component in an interior opening defined by the cup-shaped bottom electrode component. At 1412, a planarization process is performed to define the final form of the cup-shaped bottom electrode component and bottom electrode fill component, and to define a planarized insulator support surface including a planarized top surface of the cup-shaped bottom electrode component, a planarized top surface of the bottom electrode fill component and planarized top surface areas of the dielectric region on opposite sides of the bottom electrode. The cup-shaped bottom electrode component and the bottom electrode fill component collectively define the capacitor bottom electrode.

At 1414, a planar insulator is formed on the planarized insulator support surface. The planar insulator extends across and beyond the full lateral width of the bottom electrode (in the x-direction, or in both the x-direction and y-direction) and may have a uniform vertical thickness across the full lateral width of the planar insulator (in the x-direction, or in both the x-direction and y-direction). At 1416, an upper metal layer $M_{x+1}$ is formed, including (a) a top electrode over the insulator, (b) a bottom electrode connection element conductively connected to the bottom electrode contact, and (c) an upper interconnect element conductively connected to the interconnect via. The upper metal layer $M_{x+1}$ may comprise an interconnect metal layer, e.g., a first interconnect metal layer (metal-1 layer) or a higher interconnect metal layer (e.g., comprising aluminum).

The invention claimed is:

1. A device, comprising:
   a metal-insulator-metal capacitor module, comprising:
      a bottom electrode base formed in a lower metal layer;
      a bottom electrode formed in a dielectric region and conductively coupled to the bottom electrode base and comprising:
         a cup-shaped bottom electrode component formed in a bottom electrode opening in the dielectric region and; and
         a bottom electrode fill component formed in an interior opening defined by the cup-shaped bottom electrode component;
      a planar insulator formed over the bottom electrode;
      a bottom electrode contact formed in a bottom electrode contact opening in the dielectric region, the bottom electrode contact opening laterally spaced apart from the bottom electrode opening;
      a top electrode formed in an upper metal layer over the planar insulator; and
      a bottom electrode connection element formed in the upper metal layer, the bottom electrode connection element conductively connected to the bottom electrode base through the bottom electrode contact;
   wherein the cup-shaped bottom electrode component and the bottom electrode contact are formed from a conformal metal layer;
   wherein the bottom electrode fill component is formed from a fill metal layer; and
   wherein the bottom electrode opening is partially filled by the conformal metal layer and partially filled by the fill metal layer; and
   wherein the bottom electrode contact opening is filled by the conformal metal layer and is free of the fill metal layer.

2. The device of claim 1, wherein the planar insulator has a uniform vertical thickness across a full lateral width of the planar insulator.

3. The device of claim 1, wherein the planar insulator has a uniform vertical thickness across a full lateral width of the planar insulator in a first lateral direction and in a second lateral direction perpendicular to the first lateral direction.

4. The device of claim 1, wherein:
   the planar insulator is formed on a planarized insulator support surface including (a) a planarized top surface of the cup-shaped bottom electrode component, (b) a planarized top surface of the bottom electrode fill component, and (c) planarized top surface areas of the dielectric region on opposite sides of the bottom electrode; and
   the planar insulator extends laterally across and beyond a full lateral width of the bottom electrode, such that the planar insulator extends over the planarized top surface areas of the dielectric region on opposite sides of the bottom electrode.

5. The device of claim 1, wherein:
   the planar insulator extends laterally across and beyond a full lateral width of the bottom electrode, such that the planar insulator extends over portions of the dielectric region laterally adjacent the bottom electrode; and
   the planar insulator has a uniform vertical thickness across a full lateral width of the planar insulator.

6. The device of claim 1, wherein:
   the planar insulator extends laterally across and beyond a full lateral width of the bottom electrode in a first lateral direction and in a second lateral direction perpendicular to the first lateral direction, such that the planar insulator extends over portions of the dielectric region laterally adjacent the bottom electrode in both the first and second lateral directions;
   the planar insulator has a uniform vertical thickness across a full lateral width of the planar insulator in both the first and second lateral directions.

7. The device of claim 1, wherein the cup-shaped bottom electrode component is formed on the bottom electrode base.

8. The device of claim 1, wherein the planar insulator is formed on a planarized insulator support surface including a planarized top surface of the cup-shaped bottom electrode component and a planarized top surface of the bottom electrode fill component.

9. The device of claim 1, wherein the conformal metal layer comprises tungsten, and the fill metal comprises titanium nitride.

10. The device of claim 1, wherein the lower metal layer comprises a lower interconnect layer; and the upper metal layer comprises an upper interconnect layer.

11. The device of claim 1, wherein:
   the lower metal layer comprises a silicided polysilicon layer, wherein the bottom electrode base formed in the lower metal layer comprises a metal silicide region formed on a polysilicon region; and
   the upper metal layer comprises a first metal interconnect layer.

12. The device of claim 1, wherein:
   a top surface of the cup-shaped bottom electrode component and a bottom electrode fill component define a planar bottom electrode top surface; and
   the planar insulator is formed on the planar bottom electrode top surface.

13. A device, comprising:
   an interconnect structure comprising:
      a lower interconnect element formed in a lower metal layer;

an upper interconnect element formed in a upper metal layer; and an interconnect via conductively connected between the lower interconnect element and the upper interconnect element;

a metal-insulator-metal capacitor module separate from the interconnect structure, the metal-insulator-metal capacitor module comprising:

a bottom electrode base formed in the lower metal layer;

a bottom electrode conductively coupled to the bottom electrode base and comprising:
- a cup-shaped bottom electrode component; and
- a bottom electrode fill component formed in an interior opening defined by the cup-shaped bottom electrode component;

a planar insulator formed over the bottom electrode;

a top electrode formed in the upper metal layer;

wherein the cup-shaped bottom electrode component and the interconnect via are formed from a conformal metal layer;

wherein the bottom electrode fill component is formed from a fill metal layer different than the conformal metal layer; and wherein the interconnect via is free of the fill metal layer.

14. The device of claim 13, wherein:

the metal-insulator-metal capacitor module comprises a bottom electrode contact providing a conductive connection between the bottom electrode base and a bottom electrode connection element formed in the upper metal layer; and wherein the interconnect via, the bottom electrode contact, and the bottom electrode are formed in a dielectric region between the lower metal layer and the upper metal layer.

* * * * *